United States Patent
Kwon et al.

(10) Patent No.: US 11,551,764 B2
(45) Date of Patent: Jan. 10, 2023

(54) MEMORY DEVICE

(71) Applicant: Samsung Electronics Co., Ltd., Suwon-si (KR)

(72) Inventors: Joonsoo Kwon, Seoul (KR); Seongjin Kim, Gimpo-si (KR); Wandong Kim, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/315,767

(22) Filed: May 10, 2021

(65) Prior Publication Data

US 2022/0093180 A1 Mar. 24, 2022

(30) Foreign Application Priority Data

Sep. 22, 2020 (KR) .................... 10-2020-0122198

(51) Int. Cl.
*G11C 16/16* (2006.01)
*G11C 16/04* (2006.01)
*G11C 16/08* (2006.01)
*G11C 16/24* (2006.01)
*H01L 25/065* (2006.01)
*H01L 25/18* (2006.01)
*H01L 23/00* (2006.01)
(Continued)

(52) U.S. Cl.
CPC .......... *G11C 16/16* (2013.01); *G11C 16/0483* (2013.01); *G11C 16/08* (2013.01); *G11C 16/24* (2013.01); *H01L 24/08* (2013.01); *H01L 25/0657* (2013.01); *H01L 25/18* (2013.01); *H01L 27/11556* (2013.01); *H01L 27/11582* (2013.01); *H01L 2224/08145* (2013.01); *H01L 2924/1431* (2013.01); *H01L 2924/14511* (2013.01)

(58) Field of Classification Search
CPC ......... G11C 16/16; G11C 16/08; G11C 16/24; G11C 16/14; G11C 16/30
See application file for complete search history.

(56) References Cited

U.S. PATENT DOCUMENTS

| 9,329,797 B2 | 5/2016 | Darragh et al. |
| 9,805,807 B2 | 10/2017 | Lee et al. |
| 9,818,486 B2 | 11/2017 | Ziperovich |

(Continued)

FOREIGN PATENT DOCUMENTS

KR 1020150087008 A 7/2015

OTHER PUBLICATIONS

EP Extended Search Report dated Nov. 5, 2021 for corresponding application EP 21179454.0.

*Primary Examiner* — Tri M Hoang
(74) *Attorney, Agent, or Firm* — Muir Patent Law, PLLC

(57) ABSTRACT

A memory device includes a cell region in which memory blocks are disposed, each memory block including word lines stacked on a substrate, and channel structures penetrating through the word lines, and a peripheral circuit region including peripheral circuits executing an erase operation of deleting data for each of the memory blocks as a unit. The peripheral circuits control a voltage applied to each word line included in a target memory block to delete data in the erase operation, based on at least one of a position of the target memory block, a height of each word line included in the target memory block, and a profile of each channel structure.

18 Claims, 23 Drawing Sheets

(51) Int. Cl.
*H01L 27/11556* (2017.01)
*H01L 27/11582* (2017.01)

(56) References Cited

U.S. PATENT DOCUMENTS

| | | |
|---|---|---|
| 2011/0216604 A1 | 9/2011 | Mikajiri et al. |
| 2014/0160846 A1 | 6/2014 | Lee et al. |
| 2015/0205539 A1 | 7/2015 | Moon et al. |
| 2017/0069390 A1 | 3/2017 | Nam et al. |
| 2017/0169897 A1 | 6/2017 | Lee et al. |
| 2019/0348127 A1* | 11/2019 | Chin .................. G11C 16/26 |
| 2020/0105347 A1 | 4/2020 | Nam et al. |
| 2021/0366547 A1* | 11/2021 | Oh .................. H01L 27/11582 |
| 2022/0020418 A1* | 1/2022 | Choi .................. G11C 7/1066 |

\* cited by examiner

MEMORY DEVICE

CROSS-REFERENCE TO RELATED APPLICATION(S)

This application claims benefit of priority to Korean Patent Application No. 10-2020-0122198 filed on Sep. 22, 2020 in the Korean Intellectual Property Office, the disclosure of which is herein incorporated by reference in its entirety.

BACKGROUND

1. Field

The present inventive concept relates to a memory device.

2. Description of Related Art

A memory device may provide a function of writing and erasing data or reading recorded data. In order to accurately read data written to a memory device, it is necessary to appropriately control the distribution of a threshold voltage according to data written to each of the memory cells. When the threshold voltage distribution of the memory cells is not properly controlled after the erase operation of erasing the recorded data, the distribution of the memory cells after the program operation may also be deteriorated, and performance of the memory device may be degraded.

SUMMARY

One of the problems to be achieved by the technical idea of the present inventive concept is to minimize variations in threshold voltage distribution of memory cells after an erase operation by controlling a voltage input to word lines connected to memory cells and/or memory blocks in the erase operation, and to improve the performance of the memory device.

According to an embodiment of the present inventive concept, a memory device includes a cell region in which a plurality of memory blocks, each of the plurality of memory blocks including a plurality of memory cells, are disposed, and a peripheral circuit region including peripheral circuits executing an erase operation for each of the plurality of memory blocks as a unit. Each of the plurality of memory blocks comprises a plurality of word lines stacked on a substrate, a plurality of channel structures extending in a first direction, perpendicular to an upper surface of the substrate, and penetrating through the plurality of word lines, and a source region formed in the substrate and connected to the plurality of channel structures. The peripheral circuits apply an erase voltage to the source region included in at least one of the plurality of memory blocks, change a voltage of a first word line from a first bias voltage to a second bias voltage at a first point in time, the first word line being disposed in one of the at least one of the plurality of memory blocks, and change a voltage of a second word line, different from the first word line, from the first bias voltage to the second bias voltage at a second point in time, different from the first point in time, the second word line being disposed in one of the at least one of the plurality of memory blocks.

According to an embodiment of the present inventive concept, a memory device includes a cell region in which a plurality of memory blocks are disposed, each of the plurality of memory blocks including a plurality of word lines stacked on a substrate, and a plurality of channel structures penetrating through the plurality of word lines, and a peripheral circuit region including peripheral circuits configured to execute an erase operation of deleting data for each of the plurality of memory blocks as a unit. The peripheral circuits are configured to control a voltage applied to each of the plurality of word lines included in a target memory block to delete data, among the plurality of memory blocks, in the erase operation, based on at least one of a position of the target memory block, a height of each of the plurality of word lines included in the target memory block, and a profile of each of the plurality of channel structures.

According to an embodiment of the present inventive concept, a memory device includes a first memory plane and a second memory plane are disposed, each of the first memory plane and the second memory plane including a first memory block and a second memory block, a first peripheral circuit including a first page buffer, a first row decoder, and a first word line voltage generator connected to the first memory plane, and a second peripheral circuit including a second page buffer, a second row decoder, and a second word line voltage generator connected to the second memory plane, wherein each of the first word line voltage generator and the second word line voltage generator is configured to control word line voltages differently in an erase operation for the first memory block and an erase operation for the second memory block.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
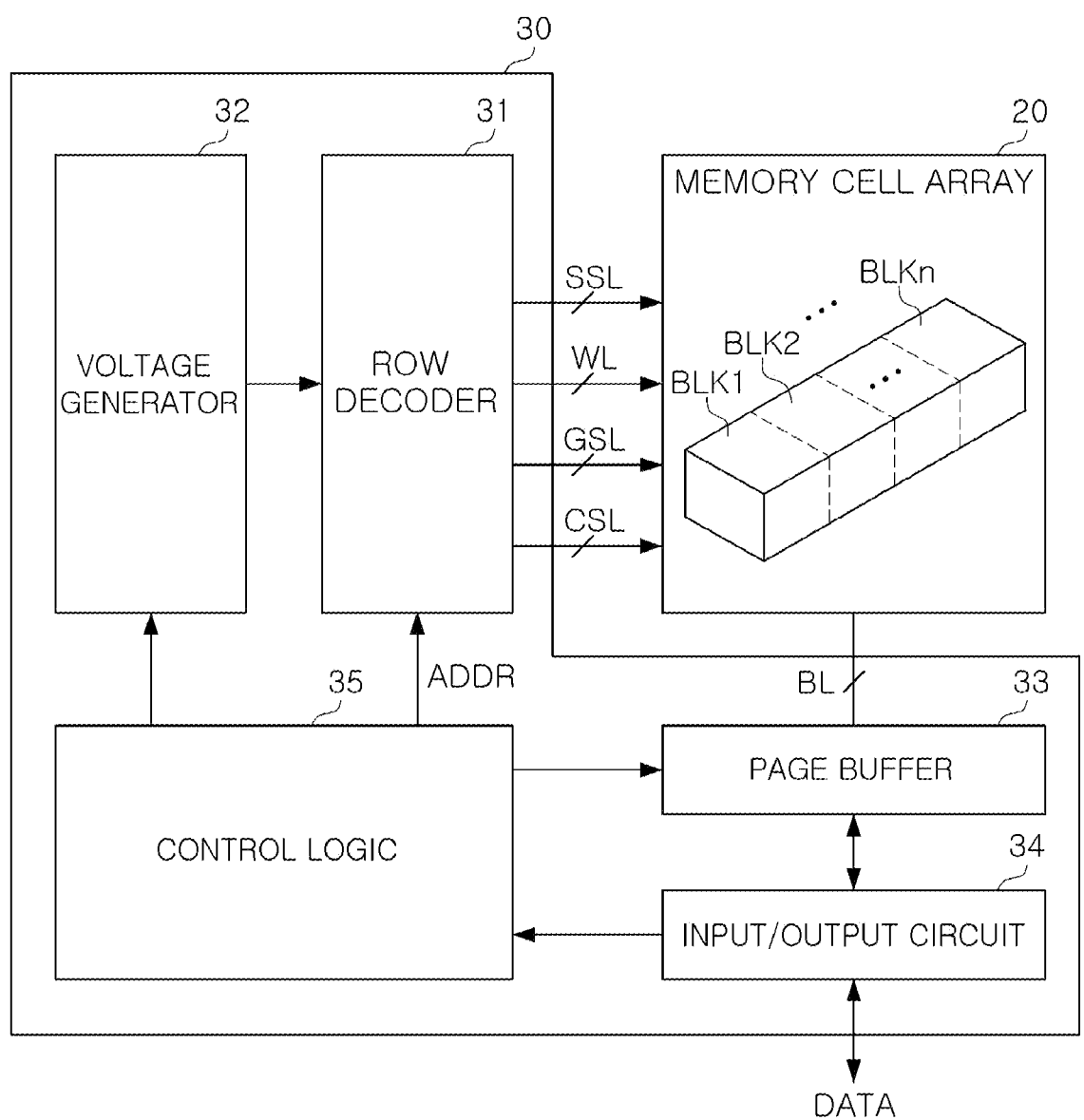
FIG. 1 a diagram schematically illustrating a memory device according to an example embodiment of the present inventive concept.

FIG. 1 a diagram schematically illustrating a memory device according to an example embodiment of the present inventive concept.

Referring to FIG. 1, a memory device 10 may include a cell region 20 and a peripheral circuit region 30. The peripheral circuit region 30 may include a peripheral circuit including a row decoder 31, a voltage generator 32, a page buffer 33, an input/output circuit 34, a control logic 35, and the like.

The cell region 20 may include a plurality of memory cells, and may be divided into a plurality of blocks BLK1 to BLKn. The plurality of blocks BLK1 to BLKn may be connected to the row decoder 31 through common source lines CSL, string selection lines SSL, word lines WL, and ground selection lines GSL. In addition, the plurality of blocks BLK1 to BLKn may be connected to the page buffer 33 through bit lines BL. For example, in each of the blocks BLK1 to BLKn, a plurality of memory cells disposed at the same height from a substrate may be connected to the same word line WL, and a plurality of memory cells disposed at the same position in a plane parallel to an upper surface of the substrate may provide a memory cell string sharing one channel layer. In addition, a portion of the memory cell strings included in each of the blocks BLK1 to BLKn may be connected to the same bit line BL.

The row decoder 31 may generate and transmit voltages for driving the word line WL by decoding address data ADDR received from the control logic 35, or the like. The row decoder 31 may input (i.e., apply) a word line voltage generated by the voltage generator 32 to the word lines WL in response to a control of the control logic 35. For example, the row decoder 31 may be connected to the word lines WL through pass transistors, and may input a word line voltage to the word lines WL when the pass transistors are turned on.

The page buffer 33 may be connected to the cell region 20 through bit lines BL, and may read data stored in memory cells or write data to the memory cells. The page buffer 33 may include a column decoder, a latch circuit, and the like. The column decoder may select at least a portion of the bit lines BL of the cell region 20, and the latch circuit may read data from the memory cell connected to the bit line BL selected by the column decoder during a read operation.

The input/output circuit 34 may receive data during a program operation and transfer the data to the page buffer 63, and output data DATA read from the memory region 50 by the page buffer 63 externally during a read operation. The input/output circuit 34 may transmit an address or command received from an external memory controller to the control logic 35.

The control logic 35 may control operations of the row decoder 31, the voltage generator 32, the page buffer 33, the input/output circuit 34, and the like. In an example embodiment, the control logic 35 may operate according to a control command transmitted from an external memory controller, or the like.

The voltage generator 32 may generate control voltages necessary for the operation of the memory device 10, for example, a program voltage, a read voltage, an erase voltage, a pass voltage, and the like, using a power voltage input from an external source. The voltage generated by the voltage generator 32 may be supplied to the peripheral circuit region 30, or may be input to the cell region 20 through the row decoder 31, or the like.

The peripheral circuit of the peripheral circuit region 30 may execute a program operation, a read operation, an erase operation, and the like, for a plurality of blocks BLK1 to BLKn, and the erase operation may be executed for each of the plurality of memory blocks BLK1 to BLKn. For example, the peripheral circuit may execute an erase operation by applying an erase voltage to a common source line CSL and/or bit lines BL connected to the target memory block to be erased from among the plurality of memory blocks BLK1 to BLKn.

In the erase operation, a predetermined bias voltage may be input to the word lines WL connected to the memory cells of the target memory block. In an example embodiment of the present inventive concept, bias voltages input to the word lines WL may be controlled in consideration of characteristics of each of the target memory block and/or the memory cells included in the target memory block. For example, bias voltages input to the word lines WL of the target memory block may be controlled in consideration of at least one of a location of target memory block, a height of word lines connected to the memory cells in the target memory block, and a profile of channel structures included in the target memory block.

Accordingly, threshold voltage distribution represented by the memory cells included in the target memory block after the erase operation may be controlled to have a target distribution, and a difference in the threshold voltage distribution of each of the plurality of memory blocks BLK1 to BLKn in an erased state may be reduced. By reducing the difference in threshold voltage distribution of the memory cells in the erased state, a voltage margin required for a read operation may be sufficiently secured, and performance of the memory device 10 may be improved.

Figure 2:
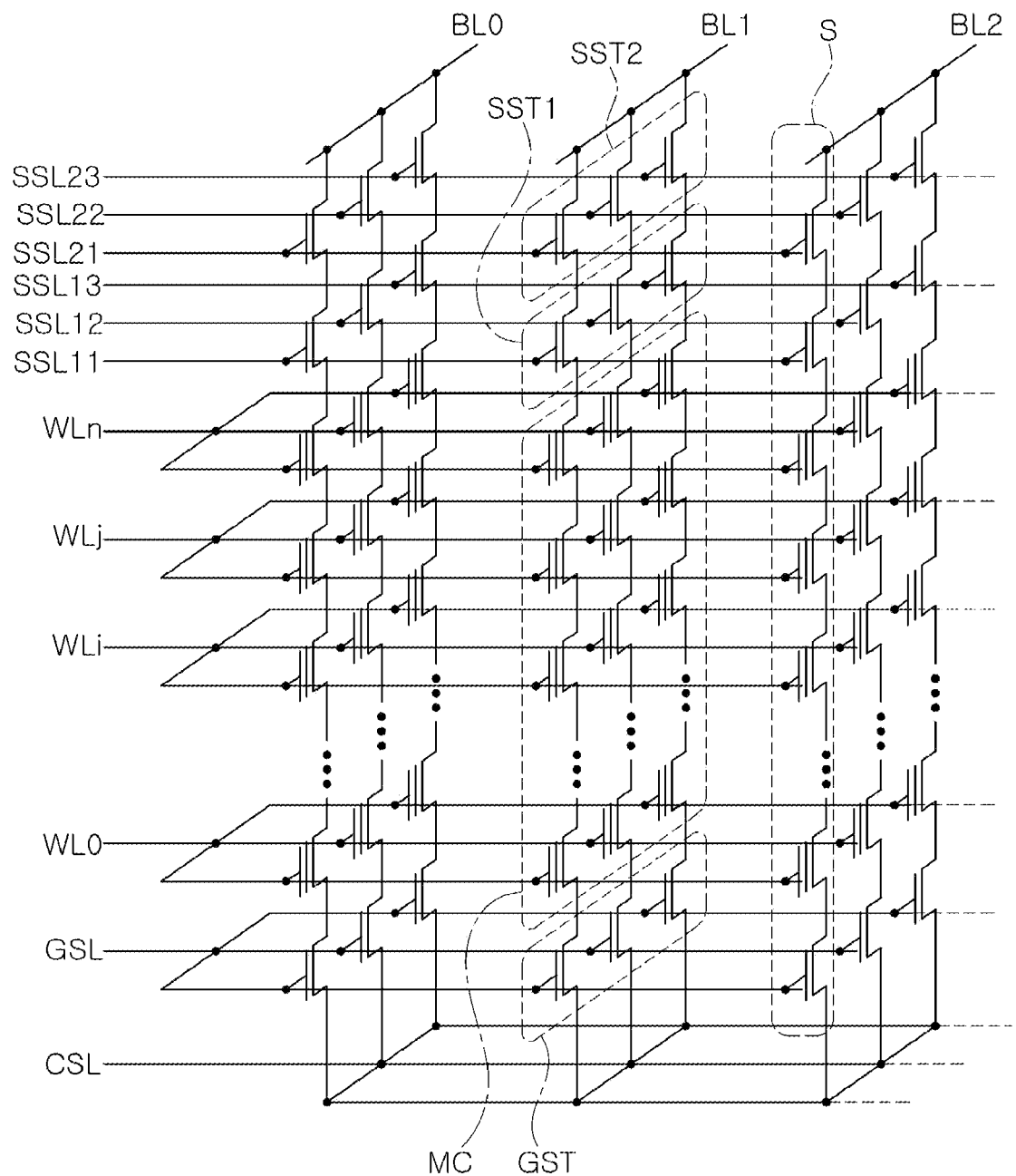
FIGS. 2 and 3 are diagrams schematically illustrating a memory device according to an example embodiment of the present inventive concept.
Figure 3:
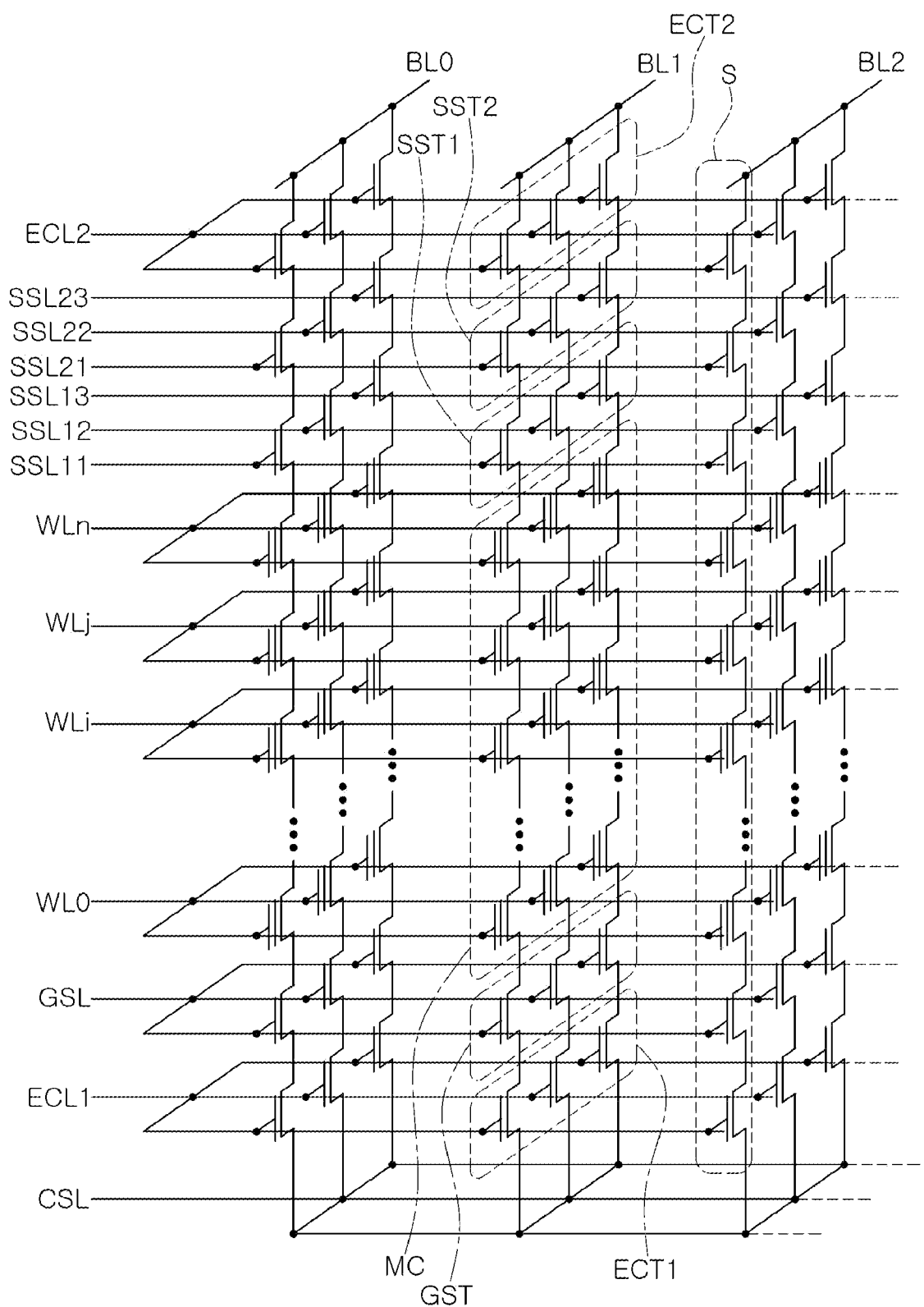

FIGS. 2 and 3 are schematic diagrams illustrating a memory device according to an example embodiment of the present inventive concept.

Referring to FIGS. 2 and 3, one memory block BLK may include a plurality of memory cell strings S, and at least a portion of the memory cell strings S may share word lines WL1 to WLn and/or bit lines BL1 to BL3.

In an example embodiment shown in FIG. 2, each of the memory cell strings S may include a plurality of memory cells MC connected between first and second string selection transistors SST1 and SST2 and a ground selection transistor GST. The first and second string selection transistors SST1 and SST2 may be connected in series to each other. The second string selection transistor SST2 may be disposed above the first string selection transistor SST1, and may be connected to one of the bit lines BL1 to BL3. The ground selection transistor GST may be connected to a common source line CSL. The common source line CSL may be electrically connected to a source region formed in the substrate. The memory cells MC included in each of the memory cell strings S may share one channel layer.

In an example embodiment illustrated in FIG. 3, each of the memory cell strings S may further include a first erase control transistor ECT1 and a second erase control transistor ECT2. The first erase control transistor ECT1 may be connected between the ground selection transistor GST and the common source line CSL, and the second control transistor ECT2 may be connected between the string selection transistors SST1 and SST2 and the bit lines BL1 to BL3. In the erase operation, the first erase control transistor ECT1 and the second erase control transistor ECT2 may generate a gate induced drain leakage current by a voltage input to a first erase control line ECL1 and a second erase control line ECL2.

The plurality of memory cells MC may be connected in series between the first and second string selection transistors SST1 and SST2 and the ground selection transistor GST. Depending on example embodiments, the number of string selection transistors SST1 and SST2 and ground selection transistor GST may be variously modified, and each of the memory cell strings S may further include at least one dummy memory cell. For example, the dummy memory cells may be connected between the first string selection transistor SST1 and the memory cells MC, and/or between the ground selection transistor GST and the memory cells MC. The gate electrodes of the plurality of memory cells MC may be connected to the word lines WL1 to WLn. In addition, the gate electrode of the ground selection transistor GST may be connected to the ground selection line GSL, and the gate electrodes of the first and second string selection transistors SST1 and SST2 may be connected to string selection lines SSL11 to SSL23.

The gate electrodes of the first erase control transistor ECT1 and the second erase control transistor ECT2 may be connected to the first erase control line ECL1 and the second erase control line ECL2, respectively.

The ground selection line GSL, the word lines WL1 to WLn, and the string selection lines SSL11 to SSL23 may be stacked in a first direction, perpendicular to the upper surface of the substrate. The ground selection line GSL, the word lines WL1 to WLn, and the string selection lines SSL11 to SSL23 may be penetrated by a channel structure including a channel layer. The channel structure may be connected to one of the bit lines BL1 to BL3.

In the erase operation, an erase voltage of a high level may be input from the source region of the substrate, and the erase voltage may be input (i.e., applied) to the channel layers through the common source line CSL. According to example embodiments, an erase voltage may also be input to the bit lines BL1 to BL3. While the erase voltage is input to the source region, a predetermined bias voltage may be input to the word lines WL. A voltage of the channel layer shared by the memory cells MC increases due to the erase voltage, and a charge trapped in a charge storage layer of the memory cells MC may be removed by the difference between the bias voltage input to the word lines WL and the voltage of the channel layer, and the erase operation may be executed.

The memory device may include a plurality of memory blocks BLK. The characteristics of each of the memory cells MC may vary depending on a location of the memory block BLK and/or a location of each of the memory cells MC in the memory plane. Therefore, when the same bias voltage input to the word lines WL is applied to the plurality of memory blocks BLK included in the memory device in the erase operation, there may be a difference in the distribution of the threshold voltage of the memory cells MC after the erase operation. In the erased state, the distribution of the threshold voltages of the memory cells MC may also affect the distribution of the threshold voltages of the memory cells MC after the program operation, which may cause performance degradation of the memory device.

In an example embodiment of the present inventive concept, a bias voltage input to the word lines WL in the erase operation may be controlled in consideration of the characteristics of the memory block BLK and/or the memory cells MC. For example, when a memory device includes a first memory block and a second memory block, a bias voltage input to the word lines WL of the first memory block in an erase operation for the first block, and a bias voltage input to the word lines WL of the second block in an erase operation for the second memory block may be differently controlled.

In addition, in an example embodiment, in an erase operation for one memory block BLK, a bias voltage input to at least a portion of the word lines WL may be differently controlled from the other portion. For example, a bias voltage input to the first word line WL1 and a bias voltage input to the nth word line WLn may be differently controlled. Therefore, the threshold voltage distribution of the memory cells MC in the erased state may be reduced, and a difference in the threshold voltage distribution of the memory cells MC in the erased state in a plurality of different memory blocks BLK may be reduced.

Figure 4:
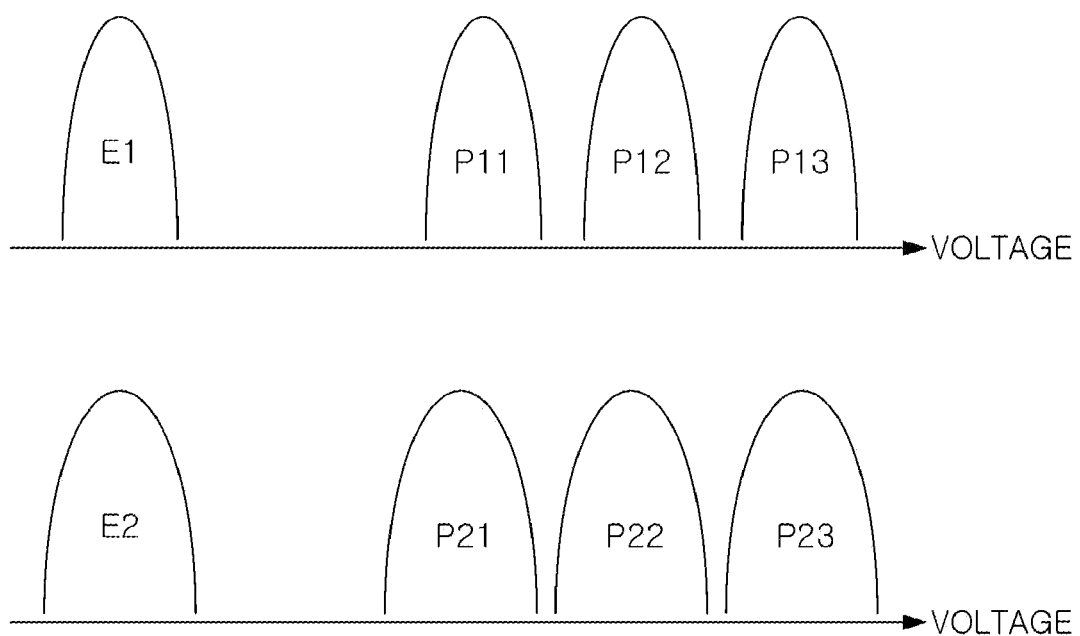
FIG. 4 is a diagram provided to describe an operation of a memory device according to an example embodiment of the present inventive concept.

FIG. 4 is a diagram provided to illustrate an operation of a memory device according to an example embodiment of the present inventive concept.

The memory device according to an example embodiment illustrated in FIG. 4 may include a first memory block BLK1 and a second memory block BLK2. As described above, the erase operation may be executed in block units. In other words, data of memory cells included in at least one of the first memory block BLK1 and the second memory block BLK2 may be simultaneously deleted by the erase operation.

The first memory block BLK1 and the second memory block BLK2 may receive the same voltages in an erase operation. For example, in the erase operation for the first memory block BLK1, the erase voltage input to the common source line of the first memory block BLK1 and the bias voltage input to the word lines may be the same as the erase voltage input to the common source line of the second memory block BLK2 and the bias voltage input to the word lines in the erase operation for the second memory block BLK2.

However, the first memory block BLK1 and the second memory block BLK2 may be disposed at different positions, and the memory cells included in the first memory block BLK1 and the memory cells included in the second memory block BLK2 may have different characteristics from each other. For example, a threshold voltage distribution E1 of the memory cells of the first memory block BLK1 in the erased state may be different from the threshold voltage distribution E2 of the memory cells of the second memory block BLK2 in the erased state. In an example embodiment illustrated in FIG. 4, the threshold voltage distribution E1 of the memory cells of the first memory block BLK1 may be smaller than the threshold voltage distribution E2 of the memory cells of the second memory block BLK2. Therefore, threshold voltage distributions P11 to P13 and P21 to P23 of memory cells in each of the program states may also be different from each other in the first memory block BLK1 and the second memory block BLK2.

Referring to FIG. 4, a difference between threshold voltage distributions E1 and E2 in an erased state may affect a program state. Accordingly, an error may occur when the same read voltage is applied to the memory cells of the first memory block BLK1 and the second memory block BLK2 in a read operation.

In an example embodiment of the present inventive concept, in order to reduce a difference between the threshold voltage distributions E1 and E2 of the first memory block BLK1 and the second memory block BLK2 in an erased state, a bias voltage input to the word lines of the first memory block BLK1 and a bias voltage input to the word lines of the second memory block BLK2 may be differently controlled. In addition, according to example embodiments, bias voltage may be differently controlled during the erase operation, for at least some of the word lines included in each of the first memory block BLK1 and the second memory block BLK2. Accordingly, the threshold voltage distributions E1 and E2 in the erased state may be similar to each other.

Figure 5:
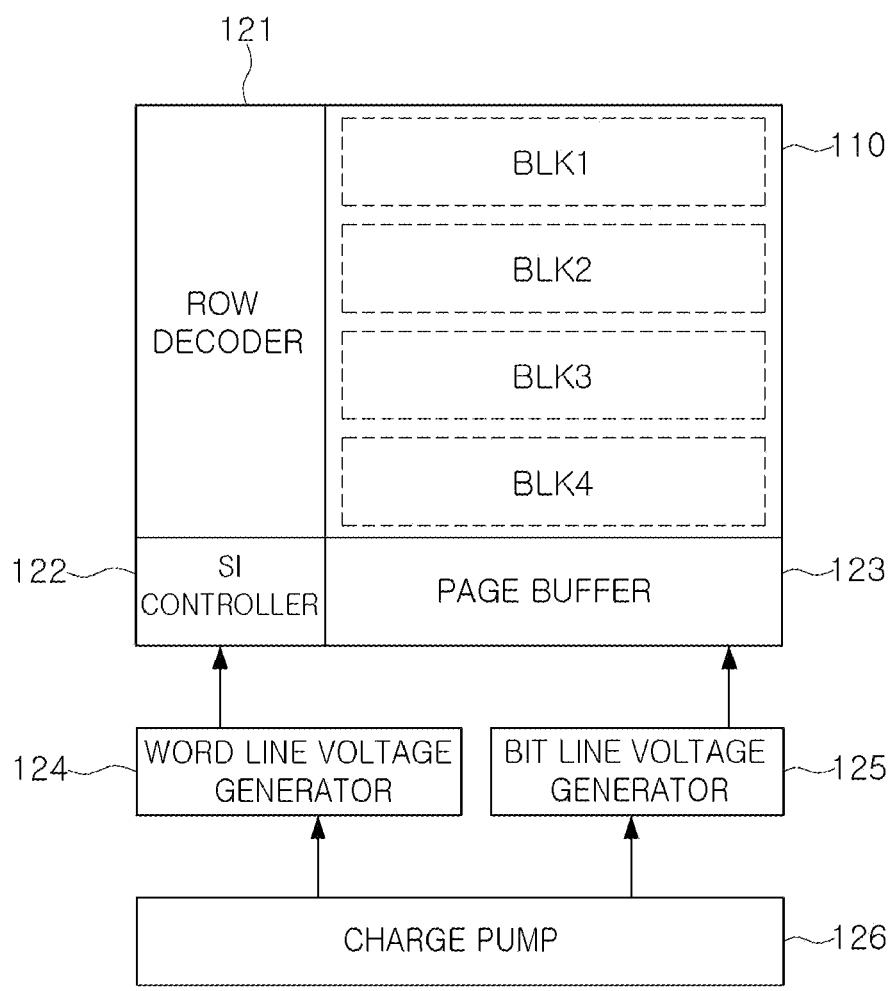
FIG. 5 is a block diagram schematically illustrating a memory device according to an example embodiment of the present inventive concept.

FIG. 5 is a block diagram schematically illustrating a memory device according to an example embodiment of the present inventive concept.

Referring to FIG. 5, a memory device 100 according to an example embodiment of the present inventive concept may include a cell region 110 having a plurality of memory blocks BLK1 to BLK4, and a peripheral circuit region including peripheral circuits controlling the cell region 110. The peripheral circuit region may include a row decoder 121, a SI controller 122, a page buffer 123, a word line voltage generator 124, a bit line voltage generator 125, a charge pump 126, and the like.

The row decoder 121 may be connected to the cell region 110 through string select lines, word lines, ground select lines, common source lines, and the like. The SI controller 122 may provide voltages generated by the word line voltage generator 124 to the row decoder 121. The word line voltage generator 124 and the bit line voltage generator 125 may generate voltages required to control the cell region 110 by using a voltage output from the charge pump 126. The page buffer 123 may be connected to the cell region 110 through bit lines, and may read data of memory cells through bit lines, or may write data to the memory cells.

In the memory device 100, an erase operation for deleting data may be executed for each of the plurality of memory blocks BLK1 to BLK4 as a unit. For example, by an erase operation of data included in the first memory block BLK1, all data of the first memory block BLK1 may be removed. In this case, data other than data to be deleted may be transferred and stored in other memory blocks BLK2 to BLK4.

Each of the plurality of memory blocks BLK1 to BLK4 may have a structure as described above with reference to FIGS. 2 and 3, and the erase operation may be executed by the erase voltage input to the word lines and the erase voltage input to the common source line and/or the bit lines. In an example embodiment, during a time when the erase voltage is input to the common source line and/or bit lines, the bias voltage input to the word lines may be controlled to reduce the difference in distribution of threshold voltages of the memory cells in the erased state.

In an example embodiment, a bias voltage input to word lines during an erase operation may be changed from a first bias voltage to a second bias voltage. When the first bias voltage is lower than the second bias voltage, an erase operation may be better executed while the first bias voltage is input to the word lines. The memory device 100 may differently set a time at which a first bias voltage is input to word lines connected to memory cells having good threshold voltage distribution characteristics than a time at which a first bias voltage is input to word lines connected memory cells having poor threshold voltage distribution characteristics. Therefore, a difference in threshold voltage distribution between memory cells may be reduced, and performance of the memory device 100 may be improved.

For example, in the erase operation of the first memory block BLK1, the memory device 100 may differently control a time at which a first bias voltage is input to the word lines of the first memory block BLK1 and a time at which a second bias voltage is input to the word lines of the second memory block BLK2. The first memory block BLK1 and the second memory block BLK2 in the cell region 110 may be physically disposed at different location, and thus, the memory cells of the first memory block BLK1 and the memory cells of the second memory block BLK2 may have different characteristics.

For example, the first memory block BLK1 and the second memory block BLK2 may be disposed on one substrate, and the first memory block BLK1 and the second memory block BLK2 may be disposed at different positions in a direction, parallel to the upper surface of the substrate. In an example embodiment, the first memory block BLK1 may be disposed closer to a physical edge of the cell region 110 than the second memory block BLK2. For example, the physical edge of the cell region 110 may extend in a direction where word lines extend. In this case, the time at which the first bias voltage is input to the word lines of the first memory block BLK1 may be set to be shorter than the time at which the first bias voltage is input to the word lines. Therefore, a difference in threshold voltage distribution of each of the memory cells included in the plurality of memory blocks BLK1 to BLK4 may be reduced.

FIGS. 6 to 12 are diagrams provided to illustrate an operation of a memory device according to example embodiments of the present inventive concept.

Figure 6:
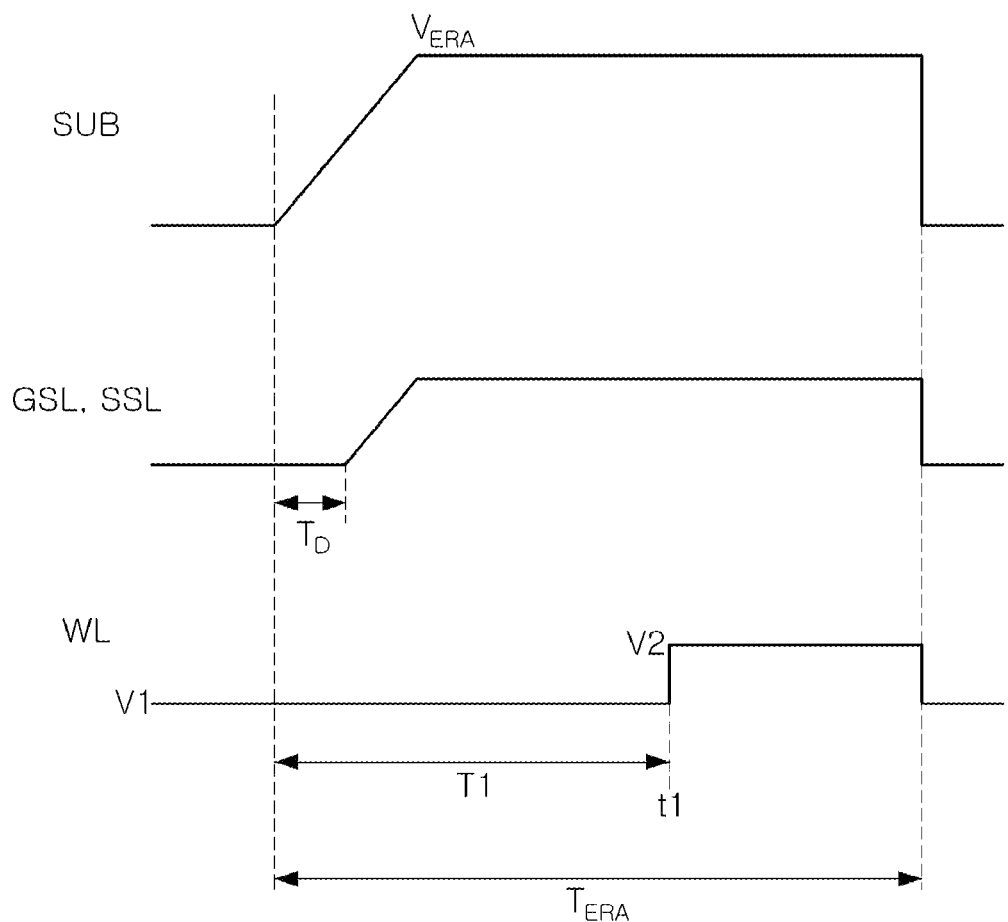
FIGS. 6 to 12 are diagrams provided to illustrate the operation of a memory device according to example embodiments of the present inventive concept.
Figure 7:
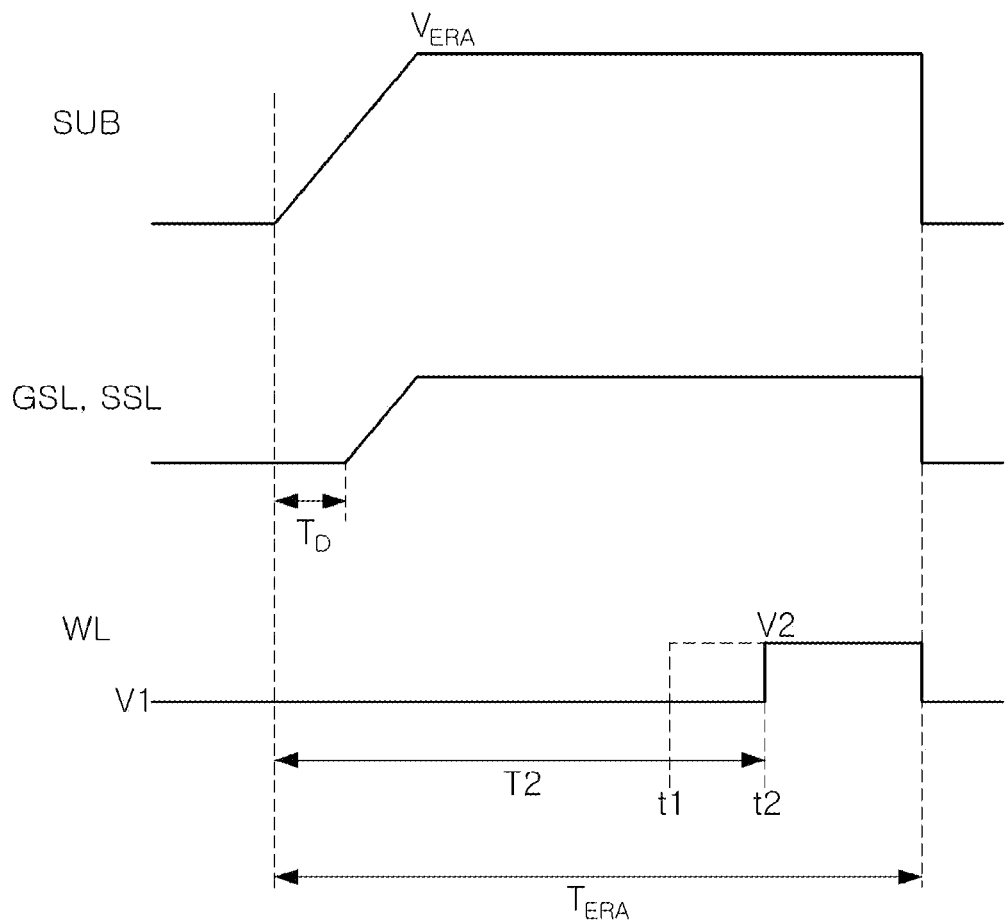

First, FIGS. 6 and 7 are diagrams provided to explain a method of controlling a bias voltage input to the word lines WL according to a position of each of a plurality of memory blocks. For example, a first memory block and a second memory block may be disposed in a cell region of the memory device, and memory cells of the first memory block and memory cells of the second memory block may have different threshold voltage distributions. FIG. 6 may be a diagram illustrating an erase operation of a first memory block, and FIG. 7 may be a diagram illustrating an erase operation of a second memory block.

First, referring to FIG. 6 to illustrate an erase operation for the first memory block BLK1, in the erase operation, an erase voltage $V_{ERA}$ may be input to the substrate SUB. For example, the erase voltage $V_{ERA}$ may be input to a source region formed in the substrate SUB, and may be input to the channel layers through the common source line CSL. Accordingly, the voltage of the channel layers may increase due to the erase voltage $V_{ERA}$.

In an example embodiment, the erase time $T_{ERA}$ may include a transition period in which the voltage of the substrate SUB increases to the erase voltage $V_{ERA}$, and a hold period in which the voltage of the substrate SUB is maintained as the erase voltage $V_{ERA}$. According to example embodiments, the erase voltage $V_{ERA}$ may also be input to bit lines, and the voltage of the channel layer may increase due to the erase voltage $V_{ERA}$. A voltage of each of the ground selection line GSL and the string selection line SSL may be maintained as a predetermined level, for example, a ground level during a delay time $T_D$, and may be floated after the delay time $T_D$ elapses.

The voltage of the word lines WL may be maintained as the first bias voltage V1 until the first point in time t1, and may be changed to the second bias voltage V2 at the first point in time t1 and may be maintained as the second voltage V2 after the first point in time t1. The first point in time t1 may belong to the hold period. The erase operation may be executed by a difference between the voltage of the channel layer increased by the erase voltage $V_{ERA}$ and the bias voltage of the word lines WL. Accordingly, during a time when the relatively low first bias voltage V1 is input to the word lines WL, the erase operation may be executed relatively rapidly. For example, once the voltage of the substrate SUB reaches the erase voltage $V_{ERA}$, a voltage difference between the erase voltage $V_{ERA}$ and the first bias voltage V1 may be applied.

In an example embodiment, the first bias voltage V1 may have a ground level. Since a first bias voltage V1 having a relatively low level is input to the word lines WL during a first time T1 before the first point in time t1 in the erase time $T_{ERA}$, the erasing operation may be executed rapidly. On the other hand, since a second bias voltage V2 having a relatively high level is input to the word lines WL after the first point in time t1 in the erase time $T_{ERA}$, the erase operation may be executed slowly. For example, the voltage of the substrate SUB is maintained as the erase voltage $V_{ERA}$ after the first point in time t1, and a voltage difference between the erase voltage $V_{ERA}$ and the second bias voltage V2 may be applied. This voltage difference may be smaller than the voltage difference between the erase voltage $V_{ERA}$ and the first bias voltage V1.

Next, referring to FIG. 7 to illustrate an erase operation for the second memory block BLK2, voltages may be input to the substrate SUB, the ground selection line GSL, and the string selection line SSL in a same/similar manner as described with reference to FIG. 6. On the other hand, the voltage of the word lines WL may be maintained as the first bias voltage V1 until a second point in time t2, and may be changed to a second bias voltage V2 at the second point in time t2 and may be maintained as the second bias voltage V2. The second point in time t2 may belong to the hold period. Accordingly, in the erase operation for the second memory block, the erase operation may be rapidly executed during the second time T2 longer than the first time T1. For example, in the erase operation for the second memory block, the voltage of the word line WL is maintained as the first bias voltage V1 during the second time T2, and in the erase operation for the first memory block, the voltage of the word line WL is maintained as the first bias voltage V1 during the first time T1. Since the second time T2 is longer than the first time T1, the erase operation of the second memory block may be more rapidly executed than the erase operation of the first memory block.

As described above, the first memory block and the second memory block may be disposed at different positions in the cell region, and accordingly, threshold voltage distributions of memory cells may be different from each other. In an example embodiment, the threshold voltage distribution of memory cells of the first memory block may be smaller than the threshold voltage distribution of memory cells of the second memory block.

In an example embodiment of the present inventive concept, a first time T1 for inputting a first bias voltage V1 to the word lines WL in the erase operation for the first memory block and a second time T2 for inputting a first bias voltage V1 to the word lines WL in the erase operation for the second memory block may be set differently from each other. In an example embodiment, for each of a first word line disposed at a first height in a first memory block and a second word line disposed at a first height in a second memory block, a time at which the first bias voltage V1 is input may be set differently. When the threshold voltage distribution of the memory cells of the second memory block is greater than the threshold voltage distribution of the memory cells of the first memory block, a time at which the first bias voltage V1 is input to the word lines WL of the second memory block may be relatively longer.

Compared to the first memory block, the difference between the erase voltage $V_{ERA}$ and the first bias voltage V1 in the second memory block may be applied longer to the memory cells, and the threshold voltage distribution of the memory cells in the second memory block may be reduced. Accordingly, a difference between the threshold voltage distribution of memory cells of the first memory block and the threshold voltage distribution of memory cells of the second memory block may be reduced. As described above, by adjusting the time at which the first bias voltage V1 is input to the word lines WL in the erase operation, a difference in threshold voltage distribution of the memory cells may be reduced.

Figure 8:
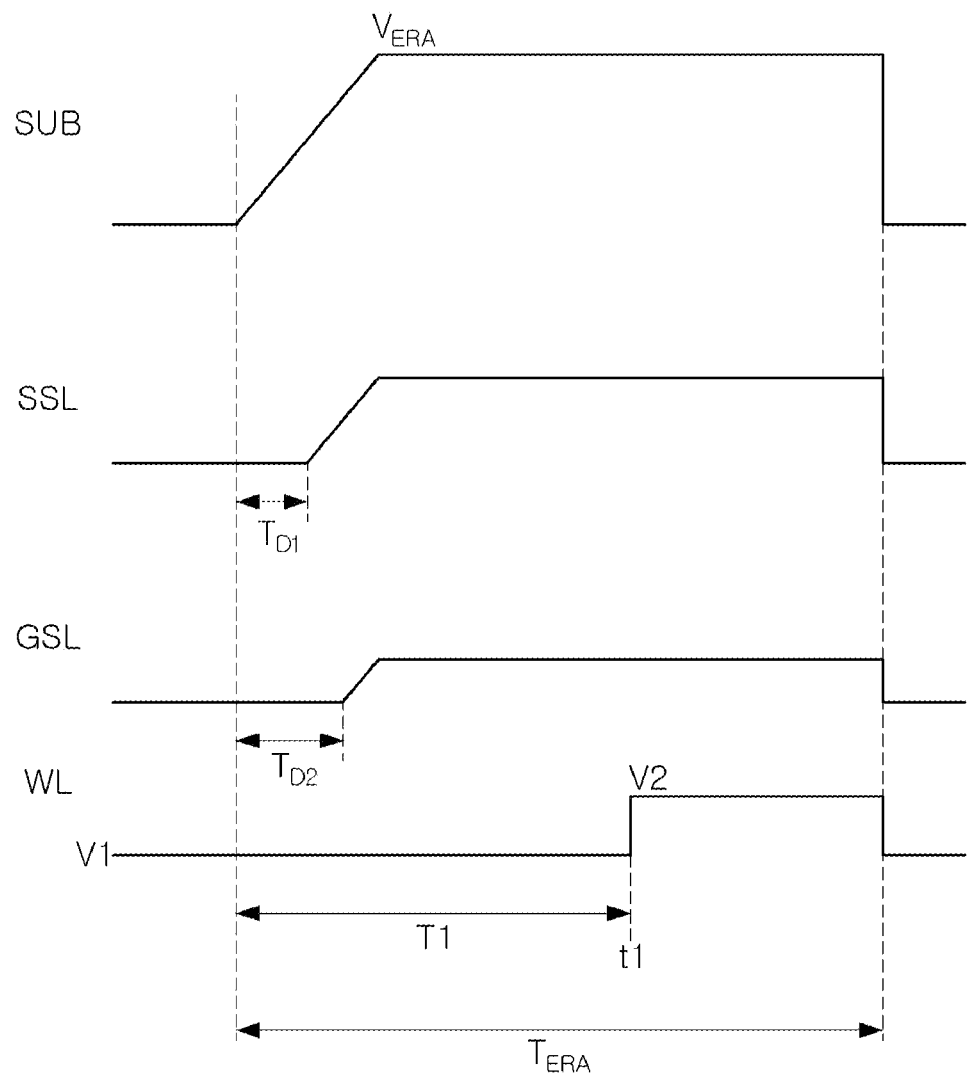

Next, referring to FIG. 8, a voltage of each of the ground selection line GSL and the string selection line SSL may be differently controlled in the erase operation. In an example embodiment illustrated in FIG. 8, the voltage of the string selection line SSL may be maintained as a ground level during a first delay time $T_{D1}$ and then, may be floated. The voltage of the string selection line SSL may increase by the erase voltage $V_{ERA}$ input to the channel layers through the substrate SUB after the first delay time $T_{D1}$. Meanwhile, the voltage of the ground selection line GSL may be maintained as a ground level for a second delay time $T_{D2}$, longer than the first delay time $T_{D1}$, and then may be floated. Accordingly, during a hold period in which the voltage of the substrate SUB is maintained as an erase voltage $V_{ERA}$, the voltage of the string selection line SSL may be greater than the voltage of the ground selection line GSL.

Figure 9:
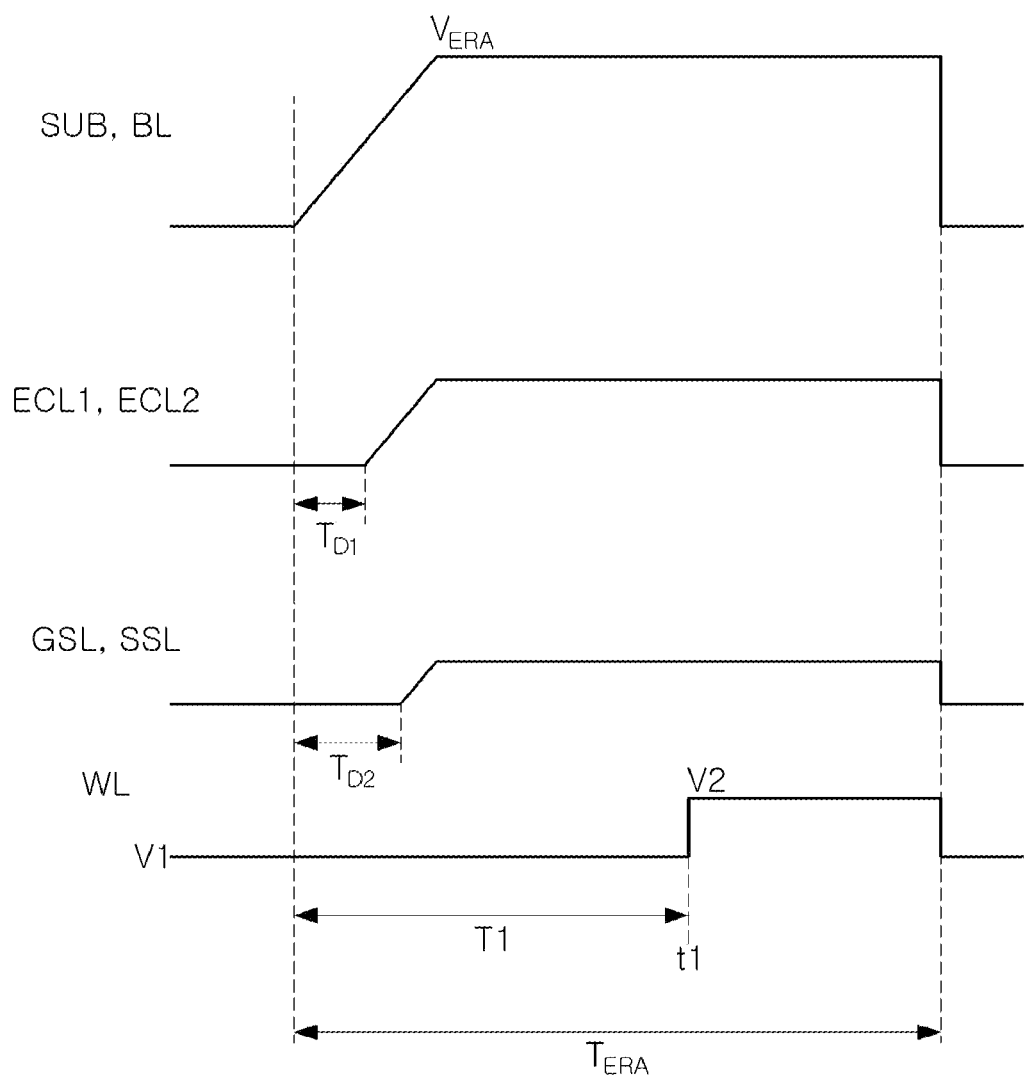

FIG. 9 may be a diagram illustrating an erase operation in a memory device in which a first erase control line ECL1 is disposed between the ground selection line GSL and the common source line CSL, and an erase operation in a memory device in which a second erase control line ECL2 is disposed between the string selection line SSL and a bit line. For example, the memory device in which the erase operation is executed as in the example embodiment illustrated in FIG. 9 may include a memory cell array represented by an equivalent circuit as in the example embodiment described with reference to FIG. 3.

Referring to FIG. 9, an erase voltage $V_{ERA}$ may be input to a substrate SUB and bit lines BL. A voltage of each of the first erase control line ECL1 and the second erase control line ECL2 may be maintained as a ground level during a first delay time $T_{D1}$ and then may be floated, and a gate induced leakage current may occur in erase control transistors connected to the first erase control line ECL1 and the second erase control line ECL2.

Each of the ground selection line GSL and the string selection line SSL may be maintained as the ground level for a second delay time $T_{D2}$, longer than the first delay time $T_{D1}$ and then may be floated. Therefore, as shown in FIG. 9, during a hold period in which the voltages of the bit lines BL and the substrate SUB are maintained as the erase voltage $V_{ERA}$, the voltages of the first erase control line ECL1 and the second erase control line ECL2 may be greater than the voltage of the ground selection line GSL and the string selection line SSL.

Figure 10:
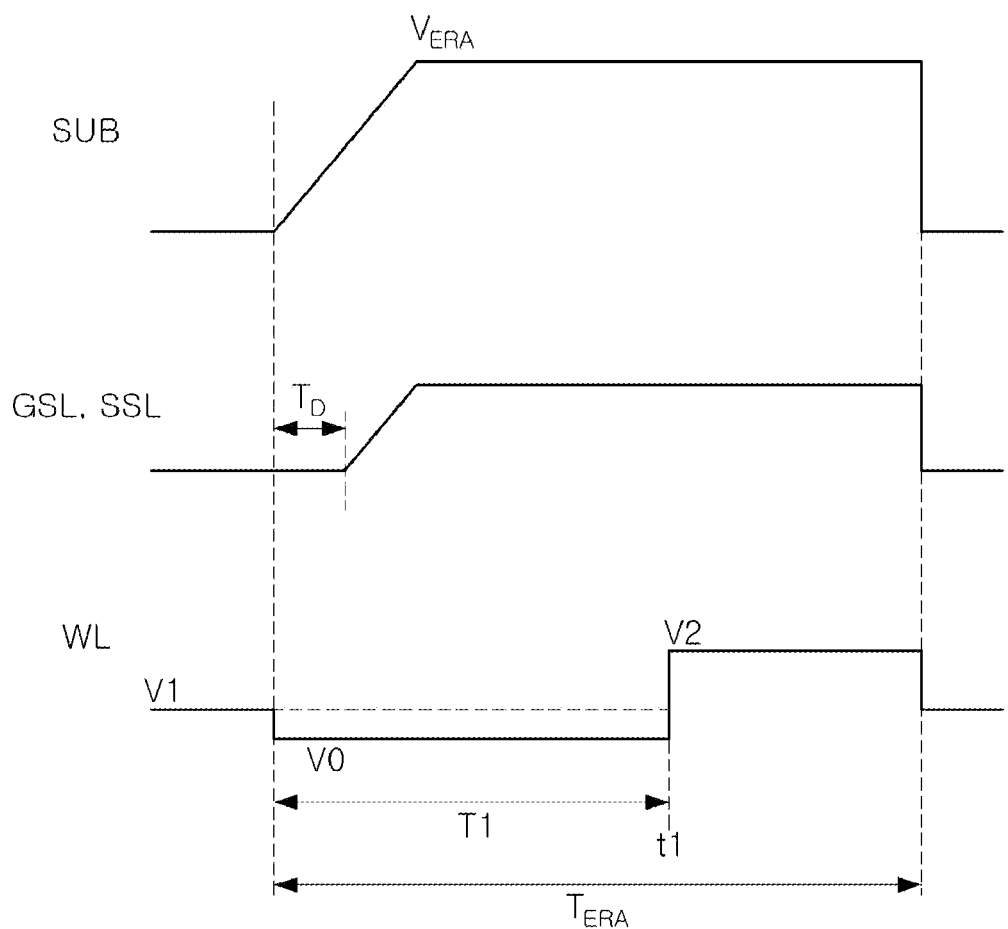

Next, referring to FIG. 10, in an erase operation for a second memory block having a relatively large threshold voltage distribution of memory cells, a bias voltage V0 having a level lower than the first bias voltage V1 may be input to the word lines WL during a first time T1. In an example embodiment, the first bias voltage V1 may have a ground level, and the bias voltage V0 input to the word lines WL during the first time T1 may be a negative voltage. Accordingly, compared to the example embodiment described with reference to FIG. 6, an erase operation may be executed faster during the first time T1. According to example embodiments, the applying of the bias voltage V0 in the method described with reference to FIG. 10 may be used in the method described with reference to FIG. 7. In other words, during the second time T2, longer than the first time T1, the bias voltage V0 having a level, smaller than the first bias voltage V1, may be input to the word lines WL, thereby executing rapidly the erase operation, and reducing the threshold voltage distribution of the memory cells.

Figure 11:
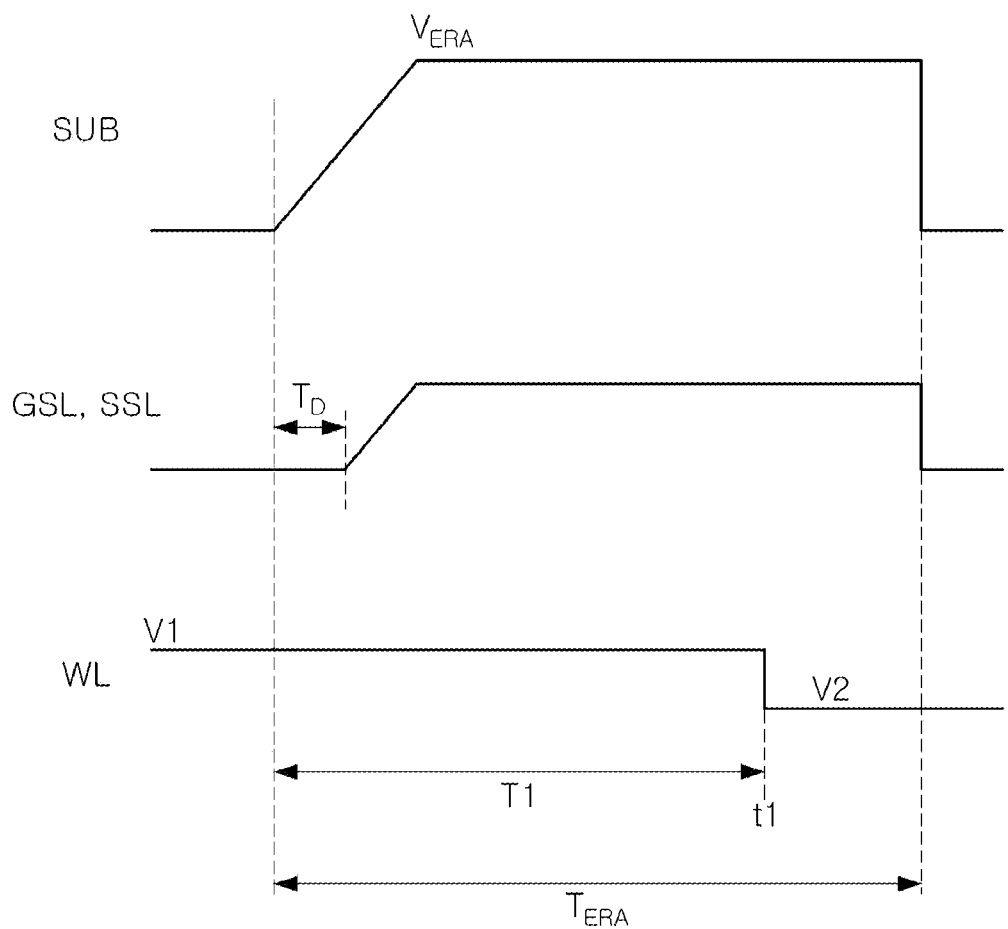
Figure 12:
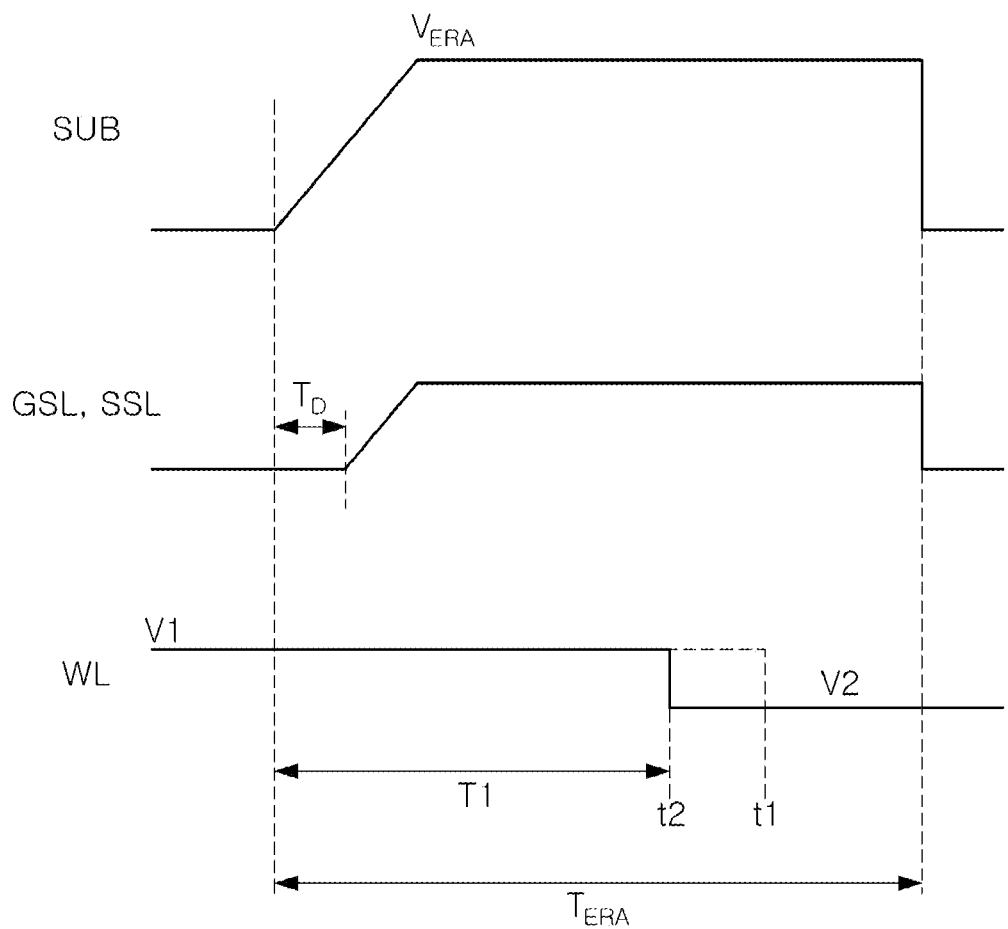

In the example embodiments illustrated in FIGS. 11 and 12, the first bias voltage V1 may have a level greater than a second bias voltage V2. For example, the second bias voltage V2 may have a ground level. FIG. 11 may be a diagram illustrating an erase operation for a first memory block having a relatively small threshold voltage distribution of memory cells, and FIG. 12 is a diagram illustrating an erase operation for a second memory block having a relatively large threshold voltage distribution of memory cells.

First, referring to FIG. 11, voltages may be input to the substrate SUB, the ground selection line GSL, and the string selection line SSL in the same/similar manner as described with reference to FIGS. 6 to 10. A voltage of the word lines WL may be maintained as the first bias voltage V1 during the first time T1. The voltage of the word lines WL may decrease to the second bias voltage V2 at the first point in time t1, and may be maintained as the second bias voltage V2. Accordingly, the erase operation may be executed rapidly after the first point in time t1 in the erase time $T_{ERA}$.

Next, referring to 12, the voltage of the word lines WL may be maintained as the first bias voltage V1 for a second time T2, shorter than the first time T1, and may be reduced to the second bias voltage V2 at a second point in time t2, earlier than the first point in time t1. Accordingly, compared with the example embodiment illustrated in FIG. 9, the time during which the erase operation is rapidly executed may increase by the time between the first point in time t1 and the second point in time t2. Since the memory cells of the second memory block have a relatively larger threshold voltage distribution compared to the memory cells of the first memory block, by controlling the voltage of the word lines WL as shown in FIGS. 11 and 12, a difference in the threshold voltage distribution between the memory cells included in the first memory block and the second memory block may be minimized.

Figure 13:
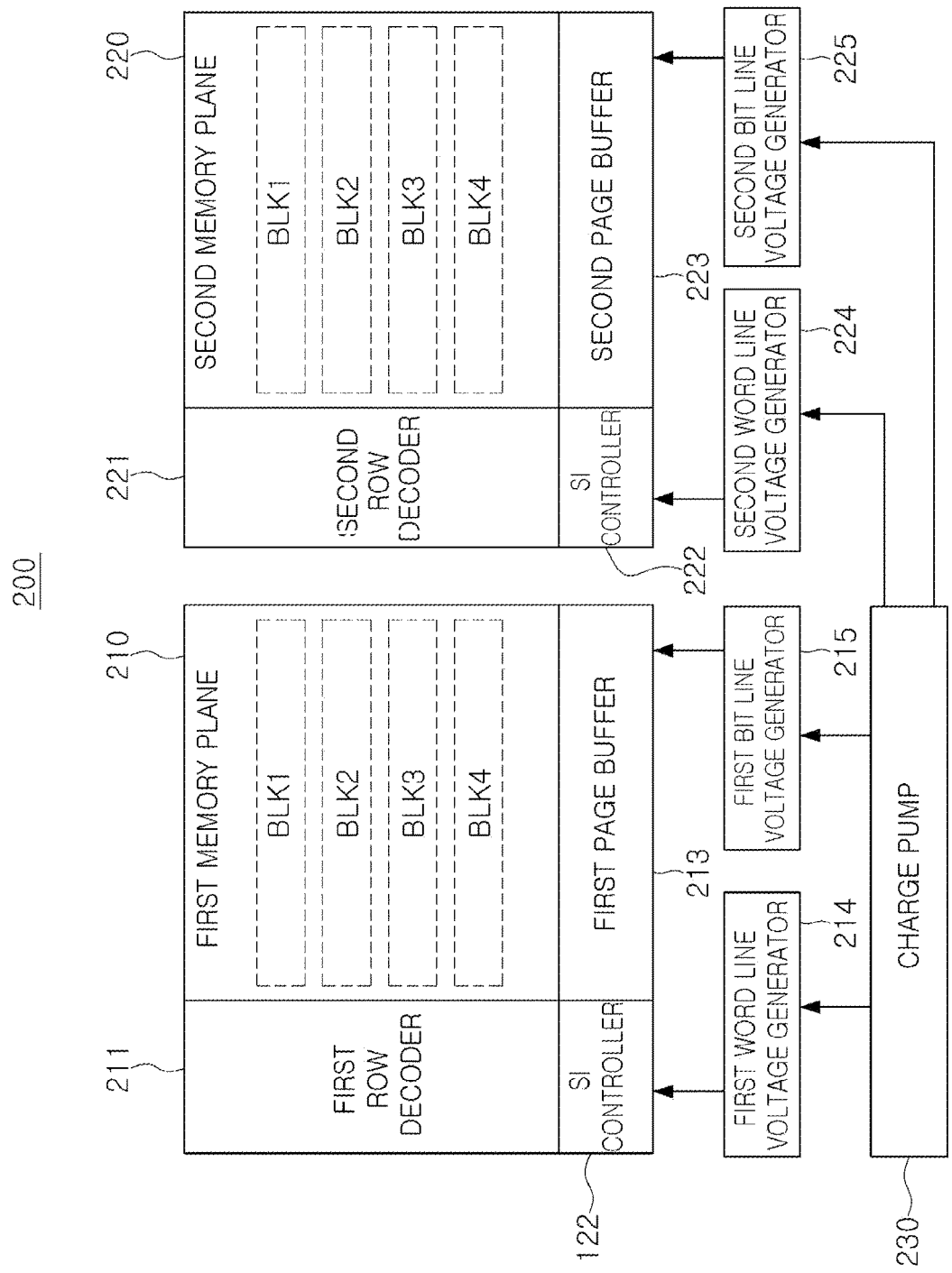
FIG. 13 is a block diagram schematically illustrating a memory device according to an example embodiment of the present inventive concept.

FIG. 13 is a block diagram schematically illustrating a memory device according to an example embodiment of the present inventive concept.

Referring to FIG. 13, a cell region of a memory device 200 according to an example embodiment of the present inventive concept may include a plurality of memory planes 210 and 220. In an example embodiment, the first memory plane 210 and the second memory plane 220 may be disposed on different substrates, respectively, but are not necessarily limited to this type. For example, the first memory plane 210 and the second memory plane 220 may be disposed on the same substrate.

The first memory plane 210 may be controlled by a first peripheral circuit region, and the second memory plane 220 may be controlled by a second peripheral circuit region. Therefore, the first memory plane 210 and the second memory plane 220 may operate independently of each other. For example, during a time when the first peripheral circuit region executes a first control operation for the first memory plane 210, the second peripheral circuit region may execute a second control operation for the second memory plane 220. Each of the first control operation and the second control operation may be one of a program operation, a read operation, and an erase operation, and the first control operation and the second control operation may be the same or different from each other.

The first peripheral circuit region may include a first peripheral circuit having a first row decoder 211, a first SI controller 212, a first page buffer 213, a first word line voltage generator 214, a first bit line voltage generator 215, and the like. The second peripheral circuit region may include a second peripheral circuit having a second row decoder 221, a second SI controller 222, a second page buffer 223, a second word line voltage generator 224, a second bit line voltage generator 225, and the like. The first peripheral circuit of the first peripheral circuit region and the second peripheral circuit of the second peripheral circuit region may share a charge pump 230, and may operate in response to a control command generated by one control logic.

Each of the first and second memory planes 210 and 220 may include a plurality of memory blocks BLK1 to BLK4. The plurality of memory blocks BLK1 to BLK4 may be disposed at different positions in a direction, parallel to the upper surface of the substrate. As described above, the erase operation may be executed for each of the plurality of memory blocks BLK1 to BLK4 as a unit.

In an example embodiment illustrated in FIG. 13, the memory device 200 may control differently an erase operation for a first memory plane 210 and an erase operation for a second memory plane 220. For example, a bias voltage input to word lines in the erase operation for the first memory plane 210 and a bias voltage input to word lines in the erase operation for the second memory plane 220 may be controlled differently.

The erase operation for the first memory plane 210 and the erase operation for the second memory plane 220 may be simultaneously executed. The bias voltage input to the word lines of the first memory plane 210 may be controlled by a first SI controller 122 and a first word line voltage generator 214, and the bias voltage input to the word lines of the second memory plane 220 may be controlled by a second SI controller 222 and a second word line voltage generator 224. Accordingly, even when the erase operation for the first memory plane 210 and the erase operation for the second memory plane 220 are simultaneously executed, the bias voltage input to the word lines of the first memory plane 210 and the bias voltage input to the word lines of the memory plane 220 may be controlled differently.

Meanwhile, as previously described with reference to FIGS. 6 and 7, a method of differently controlling the bias voltages of word lines in the erase operation for each of the plurality of memory blocks BLK1 to BLK4 may also be applied to the example embodiment described with reference to FIG. 13. For example, in the erase operation for the first memory block BLK1 included in the first memory plane 210 and the erase operation for the second memory block BLK2, bias voltages of word lines may be differently controlled. Similarly, in the erase operation for the first memory block BLK1 included in the second memory plane 220 and the erase operation for the second memory block BLK2 included in the first memory plane 210, the bias voltages of word lines may be differently controlled.

Figure 14:
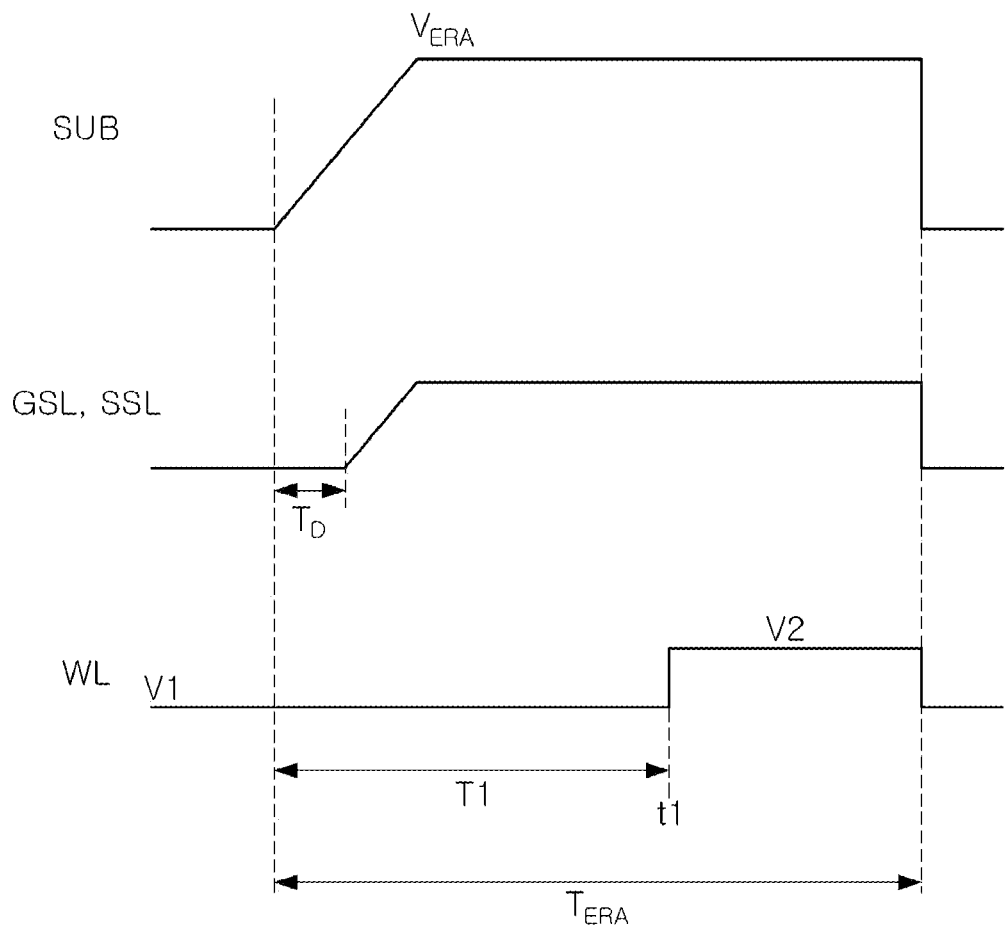
FIGS. 14 to 16 are diagrams provided to illustrate the operation of a memory device according to example embodiments of the present inventive concept.
Figure 15:
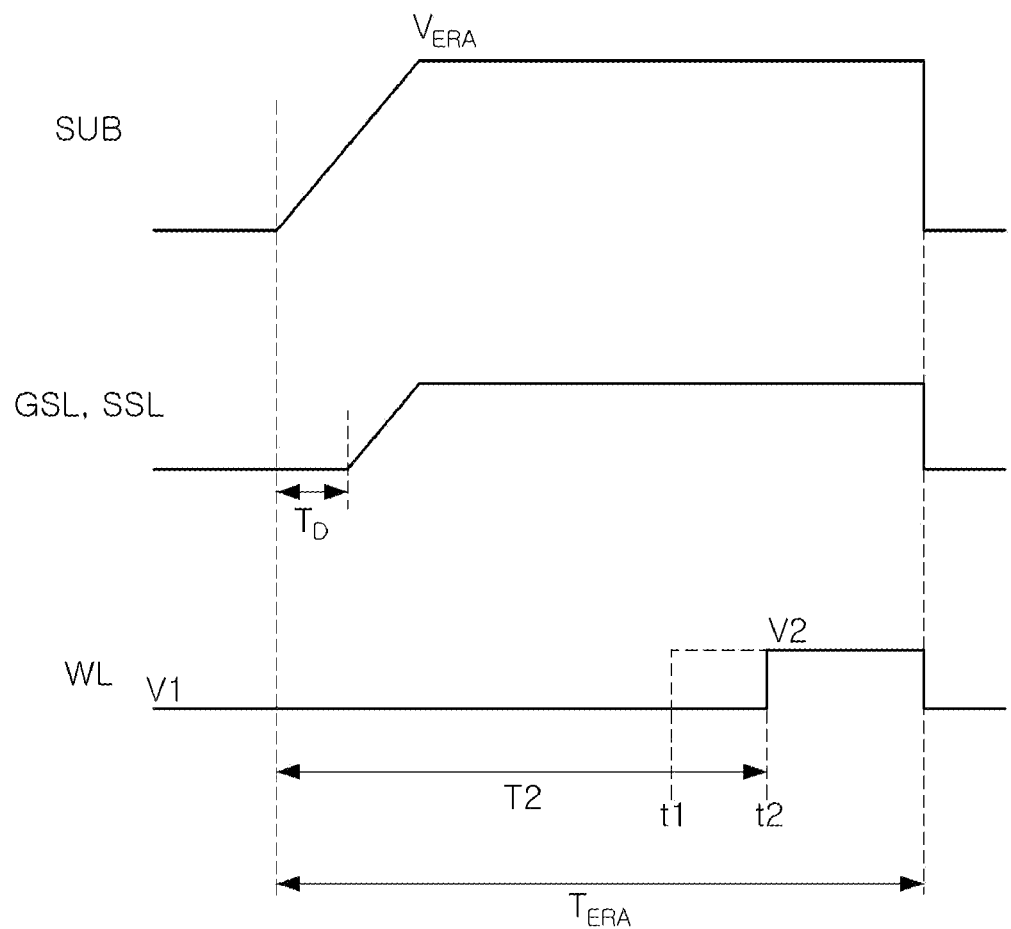
Figure 16:
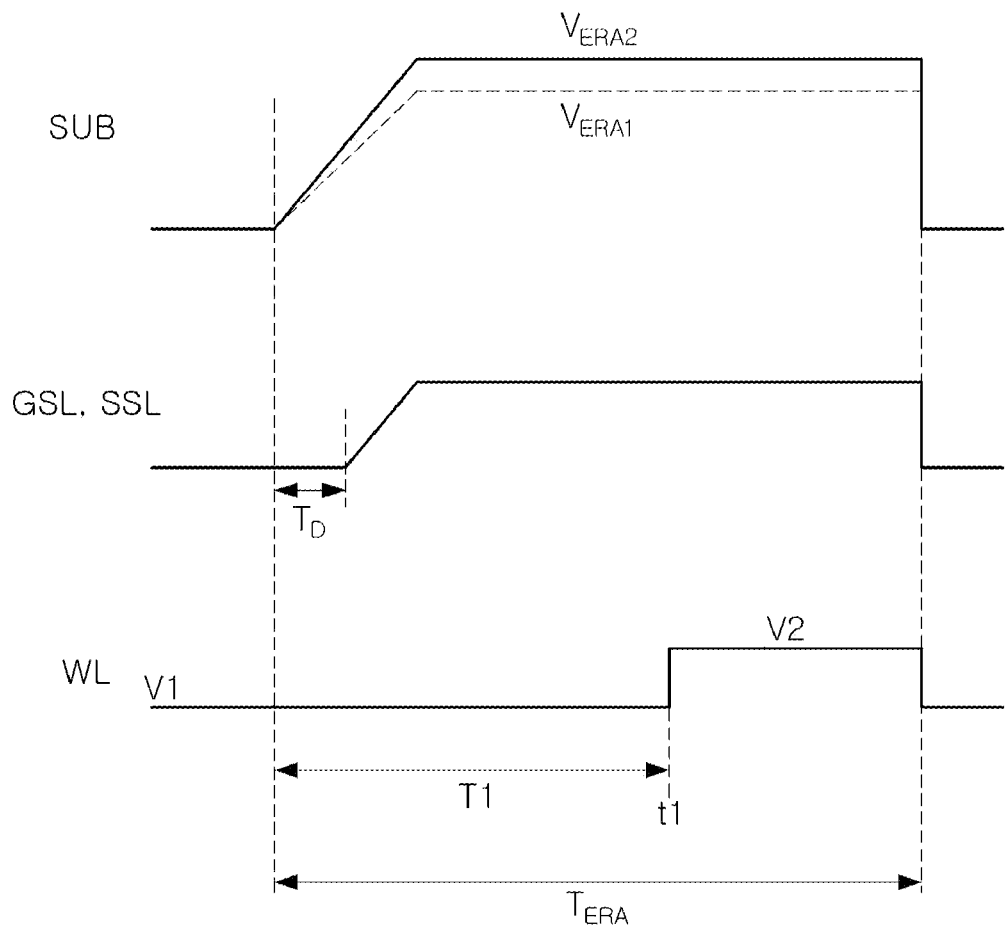

FIGS. 14 to 16 are diagrams provided to illustrate the operation of a memory device according to example embodiments of the present inventive concept.

First, FIGS. 14 and 15 are diagrams provided to illustrate a method of controlling a bias voltage input to the word lines WL in an erase operation for each of a plurality of memory planes. For example, a first memory plane and a second memory plane may be disposed in a cell region of the memory device, and each of the first and second memory planes may include a plurality of memory blocks. FIG. 14 may be a diagram illustrating an erase operation of a first memory block among memory blocks included in a first memory plane, and FIG. 15 may be a diagram illustrating an erase operation of a first memory block among memory blocks included in a second memory plane. A location in which the first memory block is disposed in the first memory plane and a location in which the first memory block is disposed in the second memory plane may be the same as each other.

First, referring to FIG. 14, in an erase operation for a first memory block of a first memory plane, an erase voltage $V_{ERA}$ may be input to a substrate SUB. As described above, the erase time $T_{ERA}$ may include a transition period in which a voltage of the substrate SUB increases to the erase voltage $V_{ERA}$, and a hold period in which the voltage of the substrate SUB is maintained as the erase voltage $V_{ERA}$. A voltage of the channel layer may increase due to the erase voltage $V_{ERA}$ input to the substrate SUB. The voltage of each of the ground selection line GSL and the string selection line SSL may be maintained as a predetermined level, for example, a ground level during a delay time $T_D$, and may be floated after the delay time $T_D$ elapses.

The voltage of the word lines WL may be maintained as the first bias voltage V1 until the first point in time t1. The voltage of the word lines WL may be changed to the second bias voltage V2 at the first point in time t1, and after the first point in time t1, may be maintained as the second bias voltage V2. In an example embodiment, the first bias voltage V1 may have a ground level. Since the first bias voltage V1 having a relatively low level is input to the word lines WL, for a first time T1 before a first point in time t1 in the erase time $T_{ERA}$, an erase operation may be executed rapidly. On the other hand, since the second bias voltage V2 having a relatively high level is input to the word lines WL after the first point in time t1 in the erase time $T_{ERA}$, the erase operation may be executed slowly.

Next, referring to FIG. 15 to describe the erase operation for the first memory block of the second memory plane, voltages may be input to the substrate SUB, the ground selection line GSL, and the string selection line SSL in the same/similar manner as described with reference to FIG. 14. On the other hand, the voltage of the word lines WL may be maintained as the first bias voltage V1 until a second point in time t2, later than the first point in time t1. The voltage of the word lines WL may be changed to the second bias voltage V2 at the second point in time t2, and after the second point in time t2, may be maintained as the second bias voltage V2. Therefore, in the erase operation for the first memory block of the second memory plane, an erase operation may be rapidly executed for a second time T2, longer than the first time T1. For example, in the erase operation for the first memory block of the first memory plane, the voltage of the word line WL is maintained as the first bias voltage V1 during the second time T2, and in the erase operation for the first memory block of the second memory plane, the voltage of the word line WL is maintained as the first bias voltage V1 during the first time T1. Since the second time T2 is longer than the first time T1, the erase operation of the first memory block in the second memory plane may be more rapidly executed than the erase operation of the first memory block of the first memory plane.

For example, memory cells of a first memory plane and memory cells of a second memory plane may have different characteristics. For example, the threshold voltage distribution of memory cells of the first memory plane may be smaller than a threshold voltage distribution of the memory cells of the second memory plane. As described with reference to FIGS. 14 and 15, the time at which the first bias voltage is input to the word lines WL in the erase operation for the second memory plane may be set longer than the time at which the first bias voltage is input to the word lines WL in the erase operation for the first memory plane, such that a difference in threshold voltage distribution occurring between the first memory plane and the second memory plane may be reduced, and performance of the memory device may be improved.

Unlike the example embodiments shown in FIGS. 14 and 15, the first bias voltage V1 input to the word lines WL may also have a level, greater than the second bias voltage V2. In this case, the time during which the first bias voltage V1 is input to the word lines WL in the erase operation for the first memory plane may be set longer than the time during which the second bias voltage is input to the word lines WL in the erase operation for the second memory plane.

Next, referring to FIG. 16, the memory device may use different erase voltages $V_{ERA1}$ and $V_{ERA2}$ in the erase operation for the first memory plane and the erase operation for the second memory plane. For example, in an erase operation for one of the memory blocks included in the first memory plane may use the first erase voltage $V_{ERA1}$, and may use the second erase voltage $V_{ERA2}$ in the erase operation for one of the memory blocks included in the second memory plane. The second erase voltage $V_{ERA2}$ may be greater than the first erase voltage $V_{ERA1}$, and may reduce the threshold voltage distribution of the memory cells included in the second memory plane such that the threshold voltage distribution of the memory cells included in the second memory plane and the threshold voltage distribution of the memory cells included in the first memory plane are similar to each other.

The first bias voltage may be input to the word lines WL included in each of the first and second memory planes before the first point in time t1, and the first bias voltage may be input after the first point in time t1. However, according to example embodiments, a method of inputting different erase voltages $V_{ERA1}$ and $V_{ERA2}$ to the memory planes may be applied together with a method of controlling a changing point in time of the bias voltage input to the word lines WL according to the memory planes.

Figure 17:
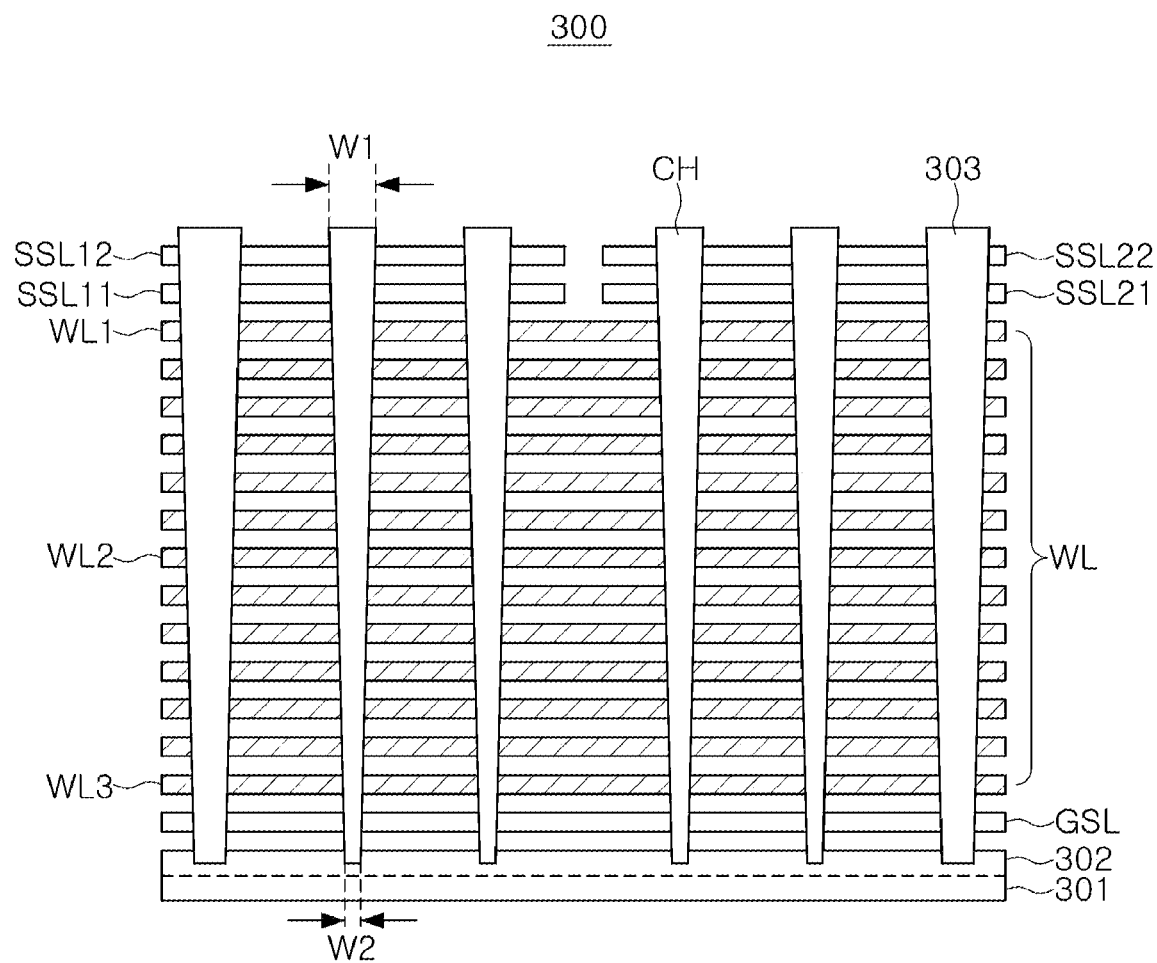
FIG. 17 is a diagram schematically illustrating a memory device according to an example embodiment of the present inventive concept.

FIG. 17 is a schematic diagram of a memory device according to an example embodiment of the present inventive concept.

FIG. 17 may be a diagram schematically illustrating a cell region of a memory device 300 according to an example embodiment of the present inventive concept. Referring to FIG. 17, a cell region may include a substrate 301, a ground selection line GSL, word lines WL and string selection lines SSL11, SSL12, SSL21, and SSL22, stacked on the substrate 301, channel structures CH, separation layers 303, and the like. The channel structures CH may extend in a direction, perpendicular to an upper surface of the substrate 301 and penetrate through the ground selection line GSL, the word lines WL, and the string selection lines SSL11, SSL12, SSL21, and SSL22. The channel structures CH may be connected to a source region 302 formed in the substrate 301. The source region 302 may be doped with an impurity, for example, n-type impurity.

The separation layers 303 may divide the word lines WL into a plurality of regions, and a plurality of memory blocks included in the cell region may be defined by the separation layers 303. For example, one memory block may be defined between a pair of separation layers 303 adjacent to each other.

Referring to FIG. 17, each of the channel structures CH may have a smaller width as it is closer to the upper surface of the substrate 301. For example, an upper surface of each of the channel structures CH may have a first width W1, and a lower surface of each of the channel structures CH may have a second width W2, smaller than the first width W1. Accordingly, characteristics of the memory cells connected to each of the word lines WL may vary depending on a height from the upper surface of the substrate 301.

For example, memory cells connected to a first word line WL1 disposed at a first height from the substrate 301 may be provided by the channel structures CH having a relatively large width, and memory cell connected to a second word line WL2 disposed at a second height, lower than the first height, may be provided by channel structures CH having a medium width. Memory cells connected to a third word line WL3 disposed at a third height, lower than the second height, may be provided by channel structures CH having a narrow width. A charge storage layer may be disposed between the channel structures CH and the word lines WL, and data may be written to the memory cells by charges trapped in the charge storage layer in a program operation. Therefore, in the erase operation for the memory block, a relatively short erase time may be applied to the memory cells connected to the third word line WL3 adjacent to the charge storage layer having a relatively small volume, and it is necessary to apply a relatively long erase time to the memory cells connected to the first word line WL1 adjacent to the charge storage layer having a relatively large volume.

In an example embodiment, in order to apply different erase times to memory cells connected to each of the first word line WL1, the second word line WL2, and the third word line WL3, during the erase time when the erase voltage is input to the substrate 301, the bias voltage input to each of the first word line WL1, the second word line WL2, and the third word line WL3 may be differently controlled. Hereinafter, it will be described with reference to FIG. 18.

Figure 18:
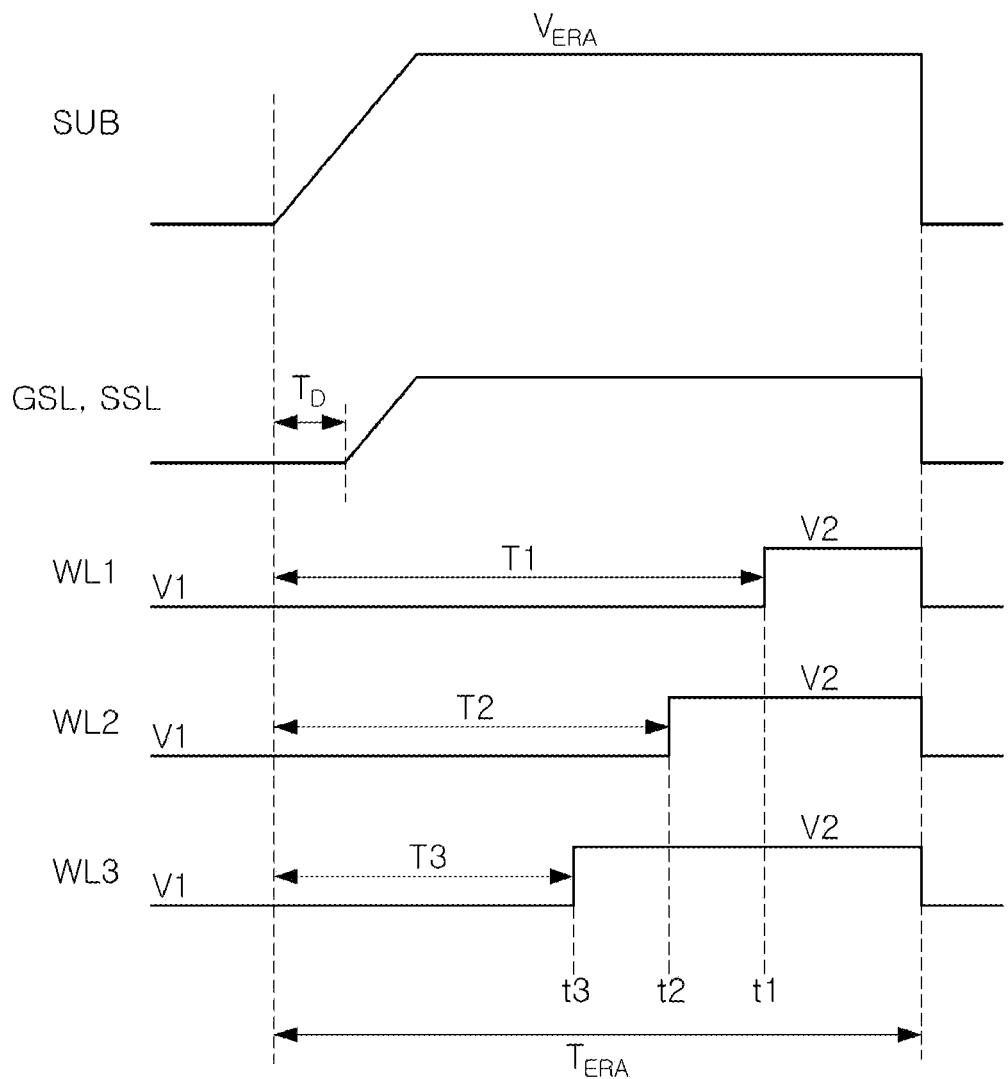
FIG. 18 is a diagram provided to explain the operation of a memory device according to an example embodiment of the present inventive concept.

FIG. 18 is a diagrams provided to illustrate an operation of a memory device according to an example embodiment of the present inventive concept.

Referring to FIG. 18, in an erase operation, an erase voltage $V_{ERA}$ may be input to a substrate SUB. For example, the erase voltage $V_{ERA}$ input through contacts connected to the substrate 301 may be transmitted to a channel layer through a common source line CSL. An erase time $T_{ERA}$ may include a transition period in which a voltage of the substrate 301 increases to the erase voltage $V_{ERA}$, and a hold period in which the voltage of the substrate 301 is maintained as the erase voltage $V_{ERA}$. A voltage of each of the ground selection line GSL and the string selection line SSL may be maintained as a predetermined level, for example, a ground level during a delay time $T_D$, and may be floated after the delay time $T_D$ elapses.

A voltage of the word lines WL may be controlled differently depending on a height from the upper surface of the substrate 301. For example, the voltage of the first word line WL1 is maintained as the first bias voltage V1 until a first point in time t1, and may be changed to the second bias voltage V2 at the first point in time t1. The voltage of the second word line WL2 may be maintained as the first bias voltage V1 until a second point in time t2, earlier than the first point in time t1, and the voltage of the third word line WL3 may be maintained as the first bias voltage V1 until a third point in time t3, earlier than the second point in time t2. In an example embodiment, the first bias voltage V1 may have a ground level.

Therefore, it is possible to obtain an effect of applying different erase times to the memory cells connected to each of the first word line WL1, the second word line WL2, and the third word line WL3. While the erase operation is strongly executed during the first time T1 in the memory cells connected to the first word line WL1, in the memory cells connected to the third word line WL3, the erase operation may be strongly executed only for the third time T3, shorter than the first time T1. Accordingly, an erase operation in consideration of the width of each of the channel structures CH may be applied to the memory cells, and a difference in threshold voltage distribution of the memory cells after the erase operation may be minimized. In an embodiment, the first bias voltage V1 applied to the first to third word lines WL1 to WL3 may be the same voltage, and the second bias voltage V2 applied to the first to third word lines WL1 to WL3 may be the same voltage. The present inventive concept is not limited thereto. For example, a voltage level of the first bias voltage V1 may be differently applied to each of the first to third word lines WL1 to WL3 depending on the heights thereof, and a voltage level of the second bias voltage V2 may be differently applied to each of the first to third word lines WL1 to WL3 depending on the heights thereof.

Figure 19:
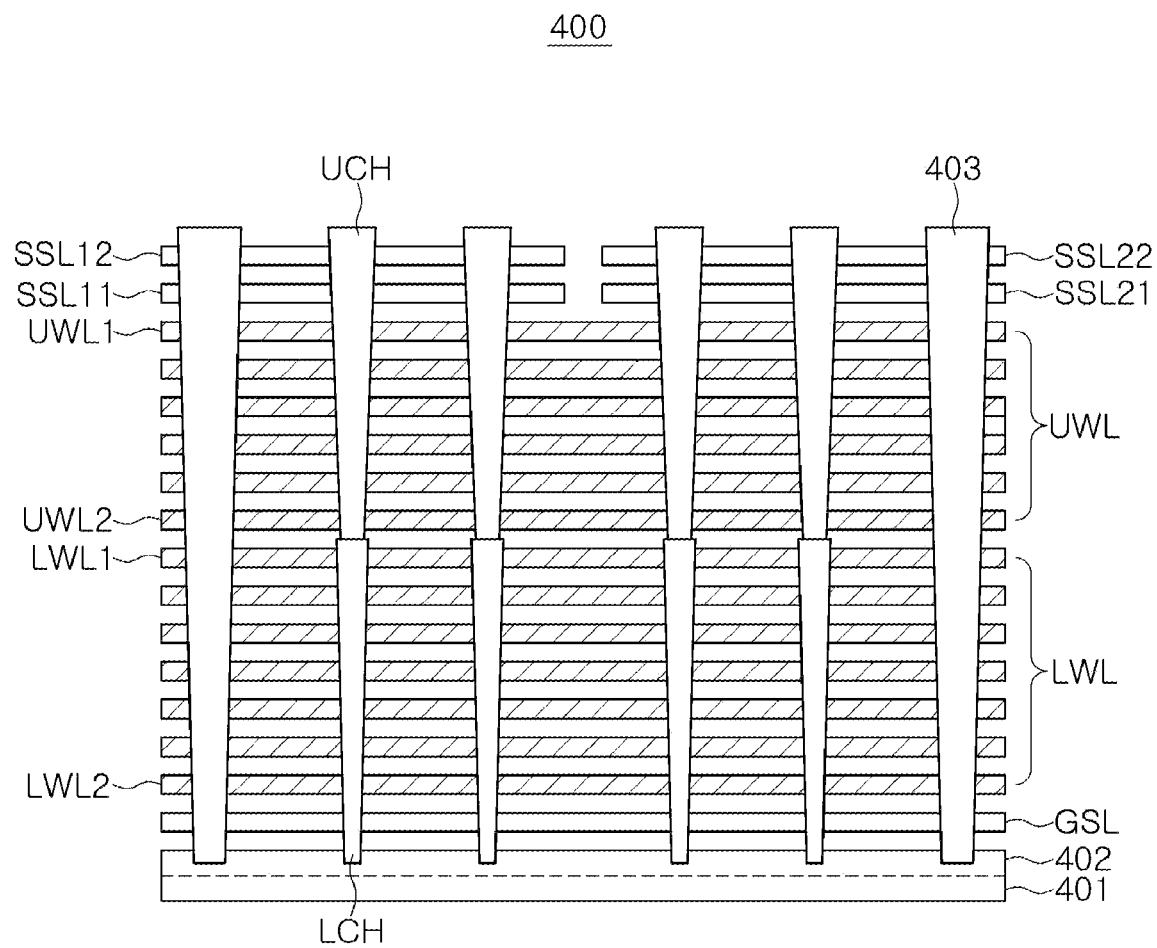
FIG. 19 is a diagram schematically illustrating a memory device according to an example embodiment of the present inventive concept.

FIG. 19 is a diagram schematically illustrating a memory device according to an example embodiment of the present inventive concept.

FIG. 19 may be a diagram schematically illustrating a cell region of a memory device 400 according to an example embodiment of the present inventive concept. Referring to FIG. 19, the cell region may include a substrate 401, a ground selection line GSL, word lines LWL, UWL, string selection lines SSL11, SSL12, SSL21, and SSL22, stacked on the substrate 401, channel structures CH, separation layers 403, and the like.

In the example embodiment illustrated in FIG. 19, each of the channel structures CH may have an upper channel structure UCH and a lower channel structure LCH. The lower channel structure LCH may penetrate through lower word lines LWL and may be connected to a source region 402 formed in the substrate 401, and the upper channel structure UCH may penetrate through the upper word lines UWL and may be connected to the lower channel structure LCH. Accordingly, a profile of each of the channel structures (i.e., an outer boundary of the lower channel structure LCH and the upper channel structure UCH connected with each other) may be different compared to that in the example embodiment illustrated in FIG. 17. The profile of a channel structure may include a geometric feature thereof such as an aspect ratio (e.g., a height of the channel structure over a diameter thereof), and a slope of a side surface of the channel structure.

Since the profile of each of the channel structures is different from that of the example embodiment shown in FIG. 15, the bias voltage input to the word lines LWL and UWL in the erase operation may also be different from that described with reference to FIG. 18. Hereinafter, it will be described with reference to FIG. 20.

Figure 20:
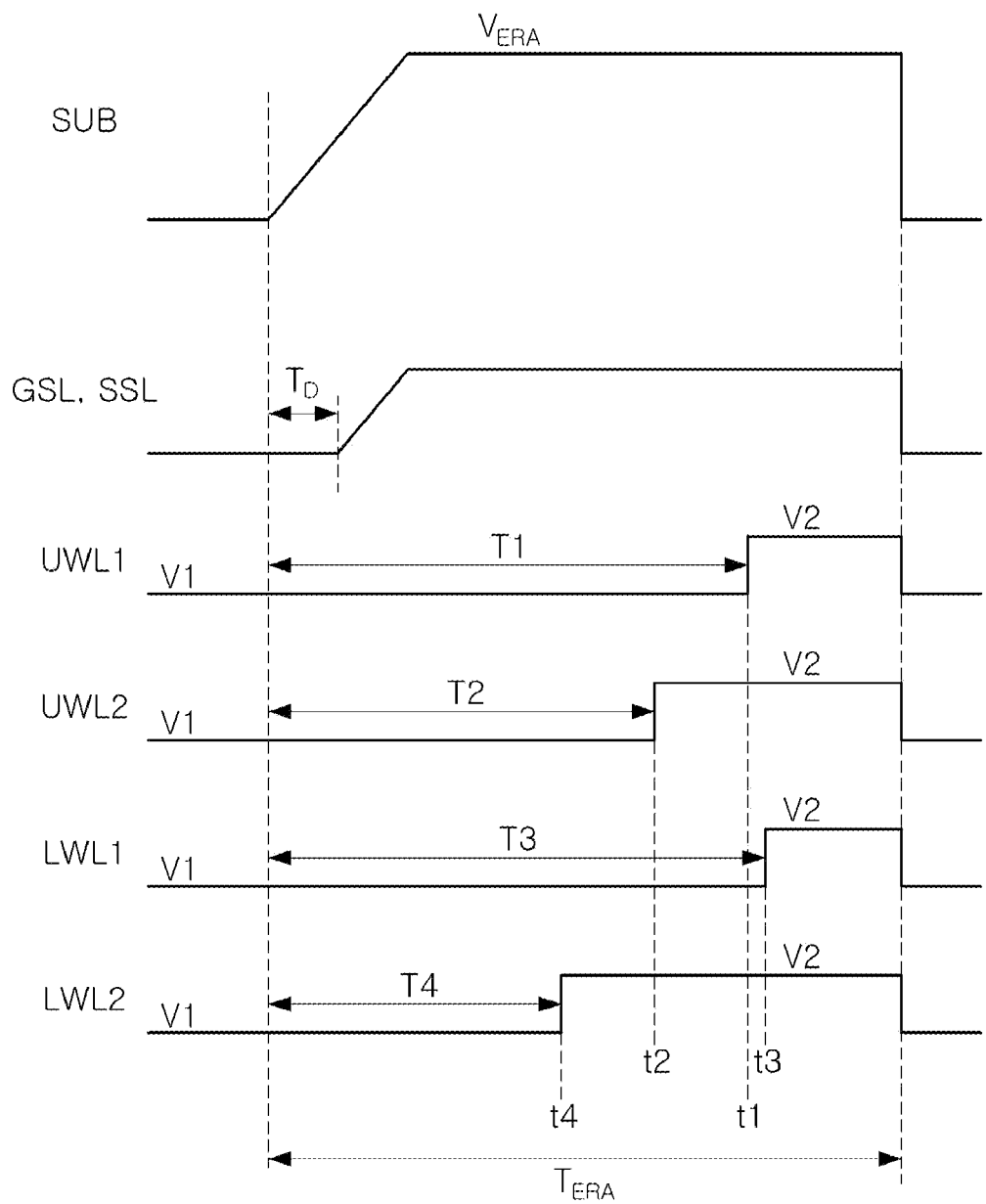
FIG. 20 is a diagram provided to illustrate the operation of a memory device according to an example embodiment of the present inventive concept.

FIG. 20 is a diagram provided to illustrate the operation of a memory device according to an example embodiment of the present inventive concept.

Referring to FIG. 20, in an erase operation, an erase voltage $V_{ERA}$ may be input through a substrate 401, and an erase time $T_{ERA}$ may include a transition period in which a voltage of the substrate 401 increase to the erase voltage $V_{ERA}$, and a hold period in which the voltage of the substrate 401 is maintained as the erase voltage $V_{ERA}$. A voltage of each of the ground selection line GSL and the string selection line SSL may be maintained as a predetermined level, for example, a ground level during a delay time $T_D$, and may be floated after the delay time $T_D$ elapses.

A voltage of the word lines WL may be controlled differently depending on the height from the upper surface of the substrate 401. For example, a voltage of a first upper word line UWL1 may be maintained as a first bias voltage V1 until a first point in time t1, and may be changed to a second bias voltage V2 at the first point in time t1. A voltage of a second upper word line UWL2 may be maintained as the first bias voltage V1 until a second point in time t2, earlier than the first point in time t1. For example, the second upper word line UWL2 may be a word line closest to a boundary between an upper channel structure UCH and a lower channel structure LCH among upper word lines UWL.

A voltage of a first lower word line LWL1 may be maintained as the first bias voltage V1 until a third point in time t3, later than the second point in time t2, and a voltage of a second lower word line LWL2 may be maintained as the first bias voltage until a fourth point in time t4, earlier than the third point in time t3. The first lower word line LWL1 may be a word line closest to a boundary between the upper channel structure UCH and the lower channel structure LCH among lower word lines LWL.

In the example embodiment described with reference to FIGS. 19 and 20, since each of the channel structures CH includes the upper channel structure UCH and the lower channel structure LCH, the first lower word line LWL1 may receive a first bias voltage V1 for a longer time than the second word line UWL2, located above the first lower word line LWL1. For example, the second time T2 during which the second upper word line UWL2 receives the first bias voltage V1 may be set shorter than the third time T3 during which the first bias voltage V1 is input to the first lower word line LWL1.

In the example embodiment illustrated in FIG. 20, it is shown that the third point in time t3 is later than the first point in time t1 and the fourth point in time t4 is earlier than the second point in time t2. The present inventive concept is not necessarily limited to this type. For example, the third point in time t3 may be earlier than the first point in time t1, and the fourth point in time t4 may be later than the second point in time t2.

In the example embodiments described with reference to FIGS. 17 to 20, the word lines WL may be divided into two or more groups, and the time at which the first bias voltage is input to each of the word lines WL may be set differently among the groups. For example, in the example embodiment illustrated in FIG. 17, the word lines WL may be divided into first to third groups according to a height from an upper surface of a substrate 301. The first group (e.g., including the first word line WL1) may be disposed at a higher position from the upper surface of the substrate 301 than the third group (e.g., including the third word line WL3). As shown in FIG. 18, a first bias voltage V1 may be input to the word lines included in the first group during a first time T1, the first bias voltage V1 may be input to the word lines included in the second group (e.g., including the second word line WL2) during a second time T2, shorter than the first time T1, and the first bias voltage V1 may be input to the word lines included in the third group during a third time T3, shorter than the second time T2.

In the example embodiments described with reference to FIGS. 17 to 20, the first bias voltage may have a higher level than the second bias voltage. In this case, the time at which the first bias voltage is input to the word lines WL may be set opposite to that of the example embodiments described with reference to FIGS. 17 to 20. For example, in the example embodiment described with reference to FIG. 18, when the first bias voltage is set to a level, greater than the second bias voltage, a time for inputting the first bias voltage to the first word line WL1 may be the earliest timing, and a time for inputting the first bias voltage to the third word line WL3 may be the latest timing.

The example embodiments described with reference to FIGS. 17 to 20 may be applied to a memory device in combination with other example embodiments described above. For example, a timing of changing the level of the bias voltage input to the word lines in the target memory block, which is a target of the erase operation, may vary according to a position of each of the plurality of memory blocks included in one memory plane.

In addition, timings for changing the level of the bias voltage input to at least a portion of the word lines may be set differently according to the height of each of the word lines in the target memory block.

In addition, when the memory device includes a plurality of memory planes, a timing of changing the level of the bias voltage input to the word lines may be set differently according to the memory plane including the target memory block among the plurality of memory planes. In an example embodiment of the present inventive concept, a bias voltage input to word lines may be differently set according to at least one of an address of a memory plane including a target memory block, an address of a target memory block within the memory plane, and an address of each of the word lines included in the target memory block, and an erase operation may be executed so that the memory cells have a target threshold voltage distribution. In addition, when the memory device includes erase control transistors, a voltage input to the erase control lines may be controlled as in the example embodiment described with reference to FIG. 9. Meanwhile, as described with reference to FIG. 8, a voltage input to each of the ground selection line and the string selection line may be controlled differently.

Figure 21:
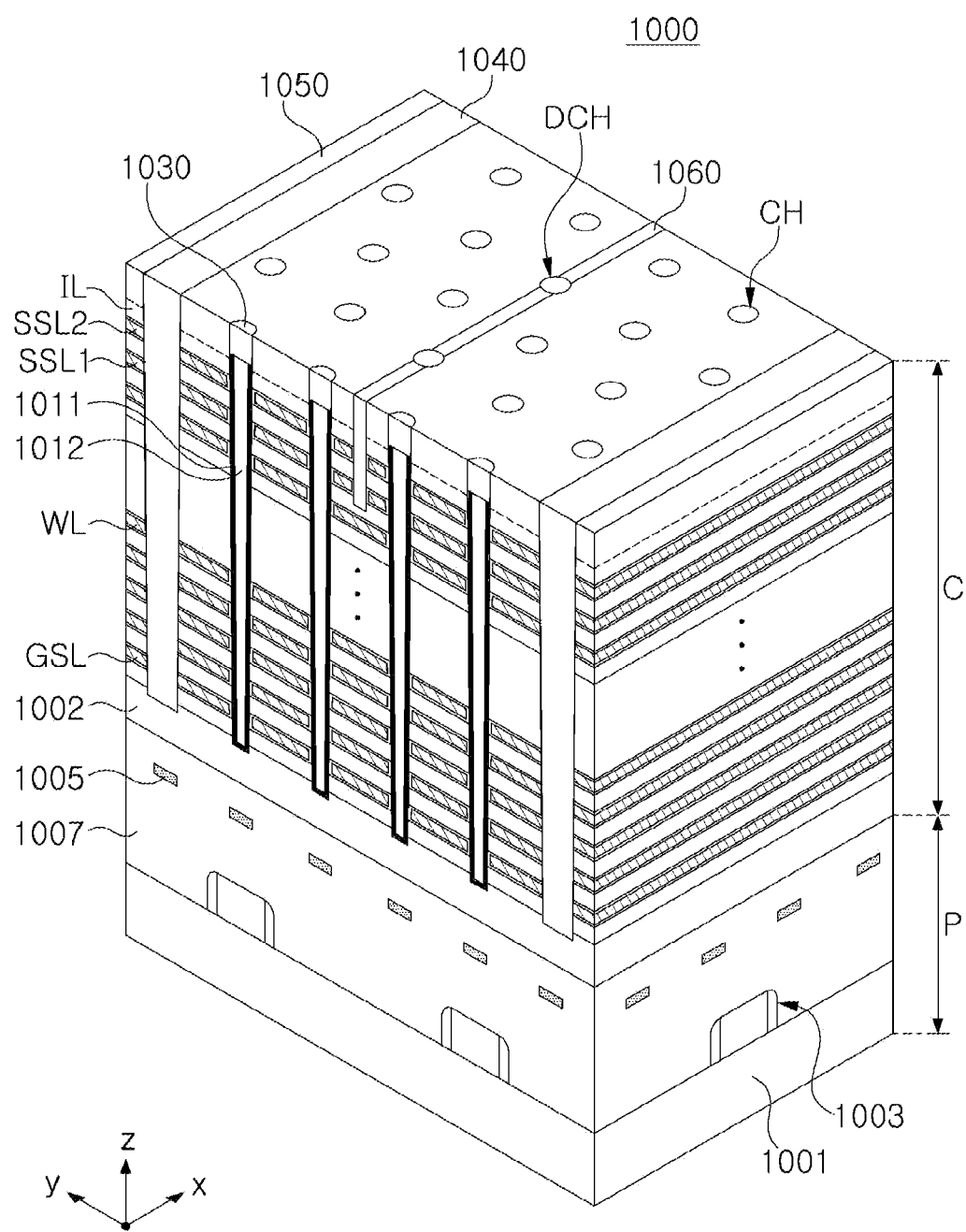
FIGS. 21 to 23 are diagrams schematically illustrating a memory device according to an example embodiment of the present inventive concept.
Figure 22:
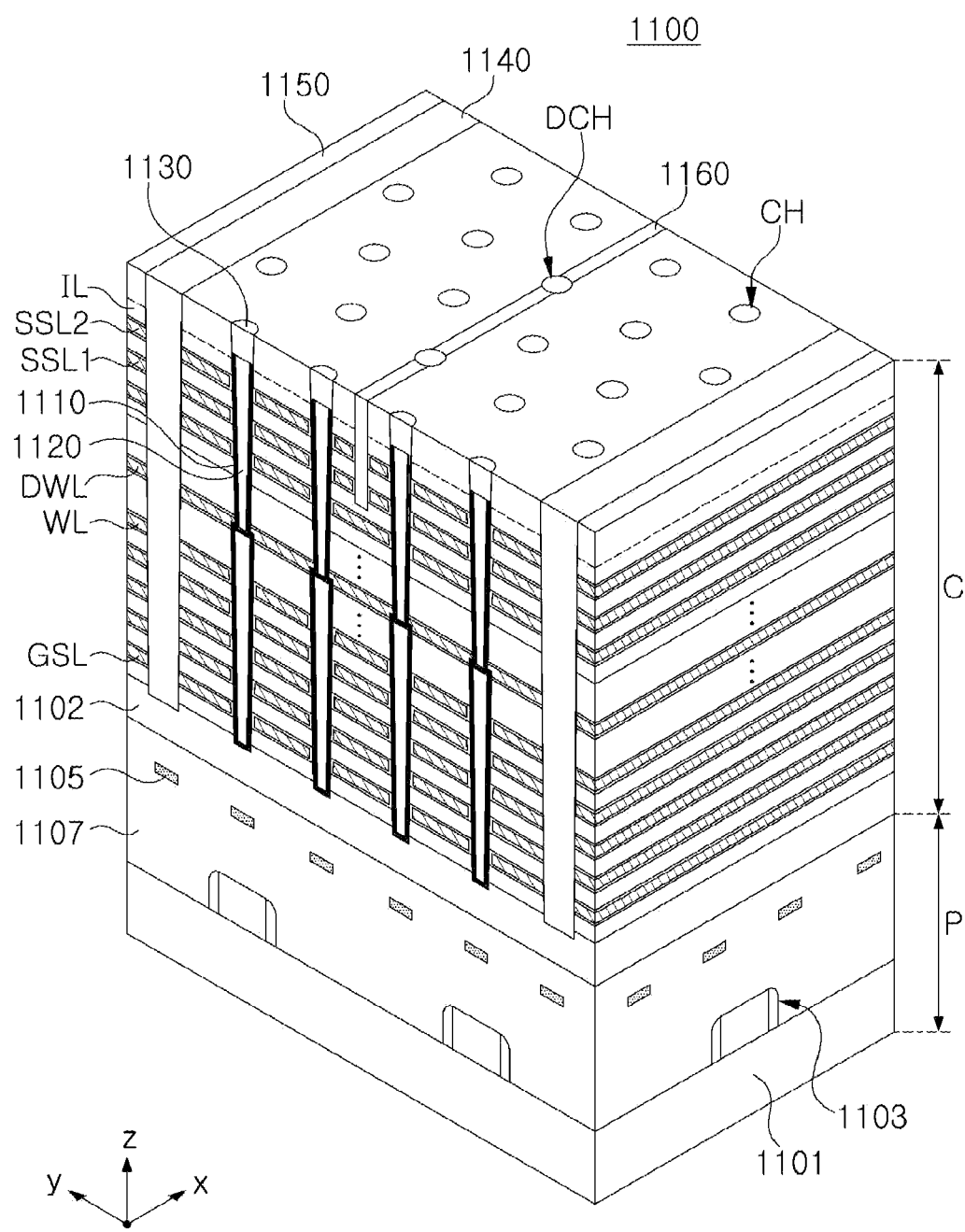
Figure 23:
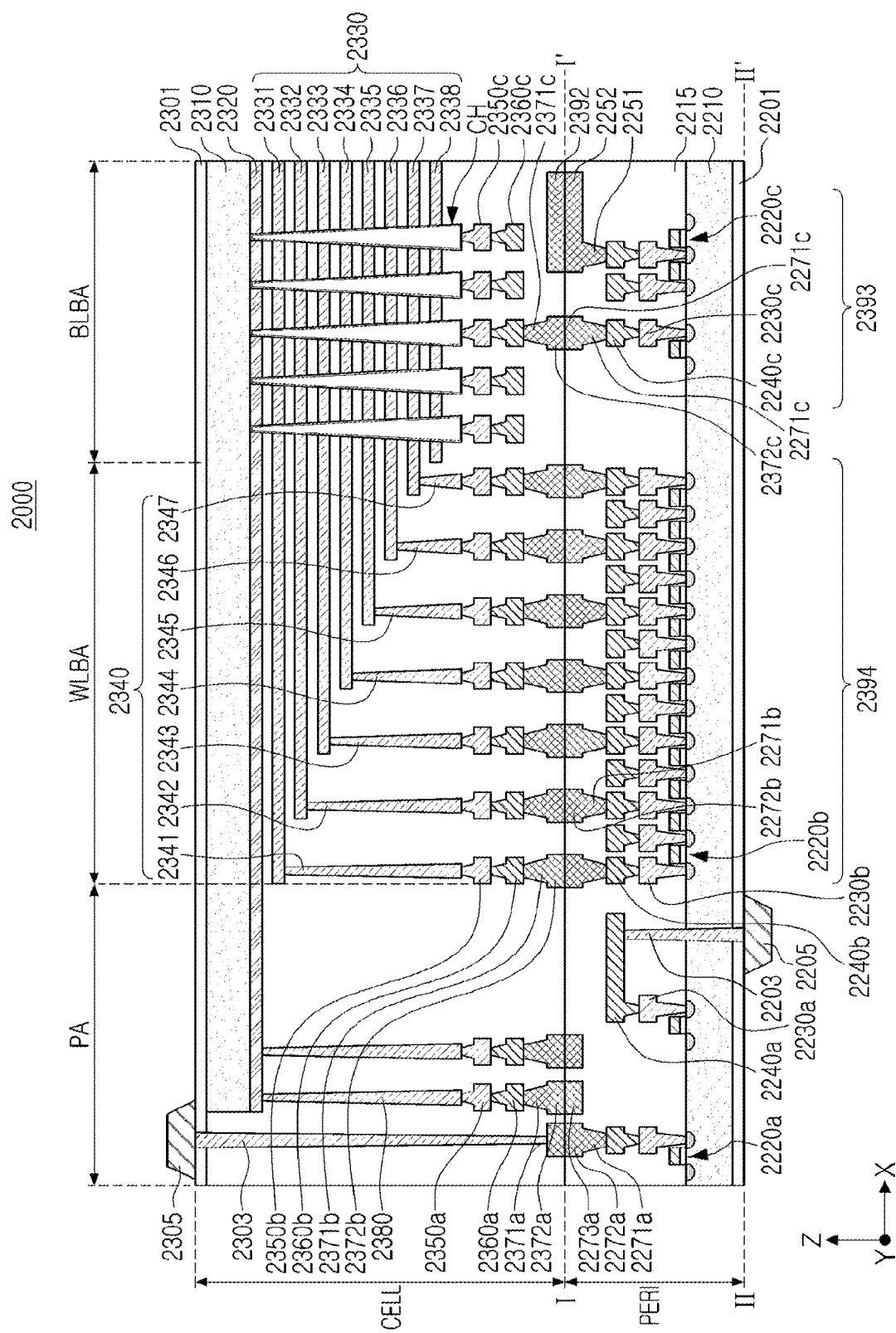

FIGS. 21 to 23 are diagrams schematically illustrating a memory device according to an example embodiment of the present inventive concept.

Each of the memory devices 1000, 1100, and 2000 according to the example embodiments illustrated in FIGS. 21 to 23 may execute an erase operation according to various example embodiments of the present inventive concept described above. For example, a bias voltage may be input to word lines during an erase time during which an erase voltage is input to a substrate, and a timing of adjusting the bias voltage input to the word lines may be set differently according to an address of a target memory block, which is subject to the erase operation, an address of a memory plane including the target memory block, and the like. In addition, the timing for changing the bias voltage applied to the word lines in the target memory block may be differently set among the word lines according to the height of each of the word lines included in the target memory block.

FIGS. 21 and 22 may be perspective views illustrating memory devices 1000 and 1100 according to an example embodiment of the present inventive concept. Referring to FIGS. 21 and 22 together, the memory devices 1000 and 1100 according to an example embodiment of the present inventive concept may include a cell region C and a peripheral circuit region P disposed above and below each other, respectively. The peripheral circuit region P may be disposed below the cell region C, the peripheral circuit region P may include first substrates 1001 and 1101, and the cell region C may include second substrates 1002 and 1102, different from the first substrates 1001 and 1101.

For example, the peripheral circuit region P may include a plurality of peripheral circuit elements 1003 and 1103 provided on the first substrate 1001 and 1101, respectively, a plurality of wiring lines 1005 and 1105 connected to the peripheral circuit elements 1003 and 1103, respectively, first interlayer insulating layer 1007 and 1107 covering the peripheral circuit elements 1003 and 1103 and the wiring lines 1005 and 1105, respectively, and the like. Peripheral circuits necessary for driving the memory devices 1000 and 1100, such as a page buffer, a row decoder, an SI controller, a charge pump, and the like may be disposed in the peripheral circuit region P.

The second substrates 1002 and 1102 included in the cell region C may be disposed on the first interlayer insulating layers 1007 and 1107, respectively. The cell region C may include a ground selection line GSL, word lines WL, and string selection lines SSL1 and SSL2, stacked on the second substrates 1002 and 1102, and a plurality of insulating layers IL. The insulating layers IL may be alternately stacked with the ground selection line GSL, the word lines WL, and the string selection lines SSL1 and SSL2. The number of the ground selection line GSL and the string selection lines SSL1 and SSL2 is not limited as illustrated in FIGS. 21 and 22, and may be variously modified.

In addition, the cell region C may include channel structures CH extending in a first direction (a Z-axis direction), perpendicular to upper surfaces of the second substrates 1002 and 1102, and the channel structures CH may penetrate through the ground selection line GSL, the word lines WL, and the string selection lines SSL1 and SSL2, and may be connected to the second substrates 1002 and 1102. The channel structures CH may include channel regions 1011 and 1110, buried insulating layers 1012 and 1120 filling internal spaces of the channel regions 1010 and 1110, bit line connection layers 1030 and 1130, and the like. Each of the channel structures CH may be connected to at least one bit line through the bit line connection layers 1030 and 1130. The ground selection line GSL, the word lines WL, the string selection lines SSL1 and SSL2, the insulating layers IL, the channel structures CH, and the like, may be defined as a stacked structure.

At least one gate insulating layer may be disposed outside of the channel regions 1010 and 1110. In an example embodiment, the gate insulating layer may include a tunneling layer, a charge storage layer, a blocking layer, and the like, sequentially disposed from the channel regions 1010 and 1110. According to an example embodiment, at least one of the tunneling layer, the charge storage layer, and the blocking layer may also be formed in a shape surrounding the ground selection line GSL, the word lines WL, and the string selection lines SSL1 and SSL2.

The ground selection line GSL, the word lines WL, and the string selection lines SSL1 and SSL2 may be covered by interlayer insulating layers 1050 and 1150. In addition, the ground selection line GSL, the word lines WL, and the string selection lines SSL1 and SSL2 may be separated into a plurality of memory blocks BLK1 and BLK2 by separation layers 1040 and 1140. Each of the plurality of memory blocks BLK1 and BLK2 may be a unit region for executing an erase operation. In an example embodiment, between the pair of separation layers 1040 and 1140 adjacent to each other in a second direction (a Y-axis direction), the string selection lines SSL1 and SSL2 may be separated into a plurality of regions by upper separation layers 1060 and 1160.

In an example embodiment, dummy channel structures DCH may be provided in a region in which the upper separation layers 1060 and 1160 are disposed. The dummy channel structures DCH may have the same structure as the channel structures CH, without being connected to a bit line.

In the memory device 1100 according to the example embodiment illustrated in FIG. 22, each of the channel structures CH and the dummy channel structures DCH may include a lower channel structure and an upper channel structure. For example, to increase the number of word lines WL stacked on each other, some word lines WL may be stacked in a lower channel structure, and the remaining word lines WL may be stacked in an upper channel structure. Accordingly, as shown in FIG. 22, each of the channel structures CH and the dummy channel structures DCH may include an upper channel structure and a lower channel structure. For example, a lower channel structure and word lines through which the lower channel structure penetrates may be defined as a lower stack structure, and an upper channel structure and word lines through which the upper channel structure penetrates may be defined as an upper stack structure. In an embodiment, source region may be formed in the substrates 1002 and 1102. The source region may be formed at the bottoms of channels CH, and may be connected to the channel regions 1010 and 1110. In an erase operation, an erase voltage may be applied, through the common source line CSL, to the source region of the substrates 1002 and 1102, and to the channel regions 1010 and 1110 connected to the source region.

Next, referring to FIG. 23, the memory device 2000 according to an example embodiment of the present inventive concept may have a chip to chip (C2C) structure. The C2C structure may refer to a structure formed by a method in which an upper chip including a cell region CELL is manufactured on a first wafer, and a lower chip including a peripheral circuit region PERI is manufactured on a second wafer, different from the first wafer, and then the upper chip and the lower chip are connected to each other by a bonding method. For example, the bonding method may refer to a method of electrically connecting bonding metal formed on the lowermost metal layer of an upper chip to bonding metal formed on the uppermost metal layer of a lower chip. For example, when the bonding metal is formed of copper (Cu), the bonding method may be a Cu—Cu bonding method, and the bonding metal may also be formed of aluminum or tungsten.

Each of the peripheral circuit region PERI and the cell region CELL of the memory device 2000 may include an external pad bonding region PA, a word line bonding region WLBA, and a bit line bonding region BLBA.

The peripheral circuit region PERI may include a first substrate 2210, an interlayer insulating layer 2215, a plurality of circuit elements 2220a, 2220b, 2220c formed on the first substrate 2210, and a plurality of circuit elements 2220a, 2220b, and 2220c, first metal layers 2230a, 2230b, and 2230c connected to each of the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having a relatively high resistance, and the second metal layers 2240a, 2240b, and 2240c may be formed of copper having a relatively low resistance.

In the present specification, only the first metal layers 2230a, 2230b, and 2230c, and the second metal layers 2240a, 2240b, and 2240c are illustrated and described, but are not limited thereto, and at least one or more metal layers may further be formed on the second metal layers 2240a, 2240b, and 2240c. At least a portion of the one or more metal layers formed above the second metal layers 2240a, 2240b, and 2240c may be formed of aluminum having a lower resistance than copper forming the second metal layers 2240a, 2240b, and 2240c.

The interlayer insulating layer 2215 may be disposed on a first substrate to cover the plurality of circuit elements 2220a, 2220b, and 2220c, the first metal layers 2230a, 2230b, and 2230c, and the second metal layers 2240a, 2240b, and 2240c, and may include an insulating material such as silicon oxide or silicon nitride.

Lower bonding metals 2271b and 2272b may be formed on the second metal layer 2240b of the word line bonding region WLBA. In the word line bonding region WLBA, the lower bonding metals 2271b and 2272b of the peripheral circuit region PERI may be electrically connected to each other by a bonding method with the upper bonding metals 2371b and 2372b of the cell region CELL, and the lower bonding metals 2271b and 2272b and the upper bonding metals 2371b and 2372b may be formed of aluminum, copper, or tungsten.

The cell region CELL may provide at least one memory block. The cell region CELL may include a second substrate 2310 and a common source line 2320. On the second substrate 2310, a plurality of word lines 2331 to 2338, which are collectively referred to using reference numeral 2330, may be stacked along a direction, perpendicular to the upper surface of the second substrate 2310 (a Z-axis direction). String selection lines and a ground selection line may be disposed on each of the upper and lower portions of the word lines 2330, and a plurality of word lines 2330 may be disposed between the string selection lines and the ground selection line.

In the bit line bonding region BLBA, the channel structure CH may extend in a direction, perpendicular to the upper surface of the second substrate 2310 to penetrate through the word lines 2330, the string selection lines, and the ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit line contact, and the second metal layer 2360c may be a bit line. In an example embodiment, the bit line 2360c may extend along a first direction (a Y-axis direction), parallel to the upper surface of the second substrate 2310.

In the example embodiment illustrated in FIG. 23, a region in which the channel structure CH, the bit line 2360c, and the like, are disposed may be defined as a bit line bonding region BLBA. The bit line 2360c may be electrically connected to circuit elements 2220c providing the page buffer 2393 in the peripheral circuit region PERI in the bit line bonding region BLBA. For example, the bit line 2360c may be connected to upper bonding metals 2371c and 2372c in the peripheral circuit region PERI, and the upper bonding metals 2371c and 2372c may be connected to lower bonding metals 2271c and 2272c connected to the circuit elements 2220c of the page buffer 2393.

In the word line bonding region WLBA, the word lines 2330 may extend along a second direction (an X-axis direction), parallel to the upper surface of the second substrate 2310, and may be connected to a plurality of cell contact plugs 2341-2347; 2340. The word lines 2330 and the cell contact plugs 2340 may be connected to each other by pads provided with at least a portion of the word lines 2330 extending in different lengths along the second direction. A first metal layer 2350b and a second metal layer 2360b may be sequentially connected to the cell contact plugs 2340 connected to the word lines 2330. The cell contact plugs 2340 may be connected to the peripheral circuit region PERI through the upper bonding metals 2371b and 2372b of the cell region CELL and the lower bonding metals 2271b and 2272b in the word line bonding region WLBA.

The cell contact plugs 2340 may be electrically connected to the circuit elements 2220b providing the row decoder 2394 in the peripheral circuit region PERI. In an example embodiment, the operating voltages of the circuit elements 2220b providing the row decoder 2394 may be different from the operating voltages of the circuit elements 2220c providing the page buffer 2393. For example, the operating voltages of the circuit elements 2220c providing the page buffer 2393, which corresponds to the page buffer 33 of FIG. 1, may be greater than the operating voltages of the circuit elements 2220b providing the row decoder 2394, which corresponds to the row decoder 31 of FIG. 1.

A common source line contact plug 2380 may be disposed in an external pad bonding region PA. The common source line contact plug 2380 may be formed of a conductive material such as metal, a metal compound, or polysilicon, and may be electrically connected to the common source line 2320. A first metal layer 2350a and a second metal layer 2360a may be sequentially stacked on the common source line contact plug 2380. For example, a region in which the common source line contact plug 2380, the first metal layer 2350a, and the second metal layer 2360a are disposed may be defined as an external pad bonding region PA.

An erase voltage for executing the erase operation may be generated in the peripheral circuit region PERI and may be input to the common source line 2320 through the common source line contact plug 2380. The erase voltage input to the common source line 2320 may be transmitted to a channel layer included in the channel structure CH. When the voltage of the channel layer increases due to the erase voltage, and a predetermined bias voltage is input to the word lines 2330, a charge may be removed in a data storage layer of the channel structure CH due to a voltage difference between the channel layer and the word lines 2330, and an erase operation may be executed. According to example embodiments, an erase voltage may also be input to the bit line 2360c so that the voltage of the channel layer may increase rapidly.

In an example embodiment of the present inventive concept, during the erase time when the erase voltage is input to the common source line contact plug 2380, the voltage input to the word lines 2330 may be changed from the first bias voltage to the second bias voltage. According to example embodiments, the first bias voltage may be lower than the second bias voltage, or the first bias voltage may be higher than the second bias voltage. A timing of changing the voltage of each of the word lines 2330 from the first bias voltage to the second bias voltage may be variously set according to an address of a memory block, which is subject to the erase operation, an address of a memory plane including the memory block, a height of each of the word lines 2330 in the memory block, and the like.

By appropriately controlling the timing of changing the voltage of each of the word lines 2330 from the first bias voltage to the second bias voltage, it is possible to minimize a difference in threshold voltage distribution of memory cells in the erased state. Therefore, the difference in threshold voltage distribution of the memory cells may also be reduced after the program operation, and errors that may occur during a read operation may be reduced by evenly securing a margin between the threshold voltage distribution according to the program state of the memory cells, and the performance of the memory device 2000 may be improved.

Meanwhile, input/output pads 2205 and 2305 may be disposed in an external pad bonding region PA. Referring to FIG. 23, a lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through the first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 from the first substrate 2210.

Referring to FIG. 23, an upper insulating film 2301 covering an upper surface of the second substrate 2310 may be formed above the second substrate 2310, and the second input/output pad 2305 on the upper insulating film 2301. The second input/output pad 2305 may be connected to at least one of the plurality of circuit elements 2220a, 2220b, and 2220c disposed in the peripheral circuit region PERI through the second input/output contact plug 2303.

According to example embodiments, the second substrate 2310, the common source line 2320, and the like are not disposed in a region in which the second input/output contact plug 2303 is disposed. In addition, the second input/output pad 2305 does not overlap word lines 2330 in a third direction (a Z-axis direction). Referring to FIG. 23, the second input/output contact plug 2303 may be separated from the second substrate 2310 in a direction, parallel to the upper surface of the second substrate 2310, and may penetrate through an interlayer insulating layer 2315 of the cell region CELL and be connected to the second input/output pad 2305.

According to example embodiments, the first input/output pad 2205 and the second input/output pad 2305 may be selectively formed. For example, the memory device 2000 may include only the first input/output pad 2205 disposed above the first substrate 2210, or include only the second input/output pad 2305 disposed above the second substrate 2310. Alternatively, the memory device 2000 may include both the first input/output pad 2205 and the second input/output pad 2305.

A metal pattern of an uppermost metal layer may exist as a dummy pattern, or an uppermost metal layer may be empty in each of the outer pad bonding region PA and the bit line bonding region BLBA included in each of the cell region CELL and the peripheral circuit region PERI.

In the external pad bonding region PA, the memory device 2000 may form a lower metal pattern 2273a having the same shape as the upper metal pattern 2372a of the cell region CELL on an uppermost metal layer of the peripheral circuit region PERI corresponding to the upper metal pattern 2372a formed on the uppermost metal layer of the cell region CELL. For example, in the external pad bonding region PA, the memory device 2000 may form a lower metal pattern 2273a in the cell region CELL and an upper metal pattern 2372a in the peripheral circuit region PERI. The lower metal pattern 2273a and the upper metal pattern 2372a may be connected with each other, and may have the same shape as each other. The upper metal pattern 2372a of the cell region CELL corresponding to the lowermost metal layer of the cell region CELL may be disposed on the uppermost metal layer of the peripheral circuit region PERI corresponding to the upper metal pattern 2372a of the peripheral circuit region PERI. The lower metal pattern 2373a formed on the uppermost metal layer of the peripheral circuit region PERI is not connected to a separate contact in the peripheral circuit area PERI. Similarly thereto, corresponding to the lower metal pattern formed on the uppermost metal layer of the peripheral circuit region PERI in the outer pad bonding region PA, an upper metal pattern having the same shape as the lower metal pattern of the peripheral circuit region PERI may be formed on the upper metal layer of the cell region CELL.

Lower bonding metals 2271b and 2272b may be formed on a second metal layer 2240b of a word line bonding region WLBA. In the word line bonding region WLBA, the lower bonding metals 2271b and 2272b may be electrically connected to each other through a bonding method with upper bonding metals 2371b and 2372b of the cell region CELL.

In addition, in the bit line bonding region BLBA, an uppermost metal layer 2392 having the same shape as the lower metal pattern 2252 of the peripheral circuit region PERI on the uppermost metal layer of the cell region CELL corresponding to the lower metal pattern 2252 formed on the uppermost metal layer of the peripheral circuit region PERI. For example, in the bit line bonding region BLBA, an upper metal pattern 2392 of the cell region CELL may have the same shape as a lower metal pattern 2252 of the peripheral circuit region PERI. The upper metal pattern 2392 may be the lowermost metal layer of the cell region CELL in the stacked structure of the cell region CELL and the peripheral circuit region PERI, and the lower metal pattern 2252 may be the uppermost metal layer of the peripheral circuit region PERI. A contact may not be formed on the upper metal pattern 2392 formed on the uppermost metal layer of the cell region CELL.

As set forth above, according to an example embodiment of the present inventive concept, a voltage input to at least a portion of word lines may be controlled differently in an erase operation. Therefore, a difference in threshold voltage distribution of memory cells after the erase operation may be reduced, and performance of the memory device may be improved.

The various and advantageous advantages and effects of the present invention are not limited to the above description, and may be more easily understood in the course of describing a specific embodiment of the present invention.

While example embodiments have been shown and described above, it will be apparent to those skilled in the art that modifications and variations could be made without departing from the scope of the present inventive concept as defined by the appended claims.

What is claimed is:

1. A memory device, comprising:
a cell region in which a plurality of memory blocks, each of the plurality of memory blocks including a plurality of memory cells, are disposed; and
a peripheral circuit region including peripheral circuits configured to execute an erase operation for each of the plurality of memory blocks as a unit,
wherein each of the plurality of memory blocks comprises a plurality of word lines stacked on a substrate, a plurality of channel structures extending in a first direction, perpendicular to an upper surface of the substrate, and penetrating through the plurality of word lines, and a source region formed in the substrate and connected to the plurality of channel structures, wherein the peripheral circuits are configured to:
apply an erase voltage to the source region included in at least one of the plurality of memory blocks;
change a voltage of a first word line from a first bias voltage to a second bias voltage at a first point in time, the first word line being disposed in a first memory block of the plurality of memory blocks; and
change a voltage of a second word line, different from the first word line, from the first bias voltage to the second bias voltage at a second point in time, different from the first point in time, the second word line being disposed in a second memory block, different from the first memory block and adjacent to the first memory block, of the plurality of memory blocks, and wherein the first word line and the second word line are disposed at the same height from the upper surface of the substrate.

2. The memory device of claim 1,
wherein the peripheral circuits are configured to:
change a voltage of a third word line, different from the first word line, from the first bias voltage to the second bias voltage at a third point in time, different from the first point in time, the third word line being disposed in the first memory block, and
wherein the first word line and the third word line are included in the same memory block among the plurality of memory blocks, and are disposed at different heights from the substrate.

3. The memory device of claim 2,
wherein a distance between the first word line and the upper surface of the substrate is shorter than a distance between the third word line and the upper surface of the substrate, and
wherein the second point in time is later than the first point in time.

4. The memory device of claim 1,
wherein the plurality of memory blocks are disposed in a cell region of a first memory plane and a cell region of a second memory plane, and
wherein each of the first memory plane and the second memory plane comprises the first memory block and the second memory block disposed at different positions in a direction, parallel to the upper surface of the substrate.

5. The memory device of claim 4,
wherein the first memory block of the first memory plane is disposed closer to an edge of the first memory plane than the second memory block of the first memory plane, the edge of the first memory plane extending in a direction in which the first word line extends, and
wherein the first point in time is earlier than the second point in time.

6. The memory device of claim 4,
wherein the first word line is in the first memory plane, and
wherein the second word line is in the second memory plane.

7. The memory device of claim 6,
wherein the peripheral circuits are configured to simultaneously execute an erase operation for one of the first memory block and the second memory block of the first memory plane, and an erase operation for one of the first memory block and the second memory block of the second memory plane.

8. The memory device of claim 6,
wherein the peripheral circuits comprise a first peripheral circuit in the first memory plane, the first peripheral circuit having a first page buffer, a first row decoder, and a first word line voltage generator, and a second peripheral circuit in the second memory plane, the second peripheral circuit having a second page buffer, a second row decoder, and a second word line voltage generator.

9. The memory device of claim 1,
wherein an erase time during which the erase voltage is applied to the source region comprises a transition period in which the erase voltage increases, and a hold period in which the erase voltage is maintained as a constant level, and
wherein the first point in time and the second point in time belong to the hold period.

10. A memory device, comprising:
a cell region in which a plurality of memory blocks are disposed, each of the plurality of memory blocks including a plurality of word lines stacked on a substrate, and a plurality of channel structures penetrating through the plurality of word lines; and
a peripheral circuit region including peripheral circuits configured to execute an erase operation of deleting data for each of the plurality of memory blocks as a unit,
wherein the peripheral circuits are configured to, in the erase operation, control a voltage applied to each of the plurality of word lines included in a first memory block to delete data, among the plurality of memory blocks, based on a position of the first memory block in the cell region.

11. The memory device of claim 10,
wherein the peripheral circuits are configured to control at least one of a voltage level of a bias voltage applied to each of the plurality of word lines included in the first memory block, and a timing of changing the voltage level of the bias voltage, in the erase operation.

12. The memory device of claim 11,
wherein the plurality of word lines comprise a first word line disposed at a first height from the substrate, and a second word line disposed at a second height from the substrate, the first height being higher than the second height, and
wherein the peripheral circuits are configured, during the erase operation, to:
apply a first bias voltage to the first word line for a first time;
apply, after the first time, a second bias voltage, greater than the first bias voltage, to the first word line;
apply the first bias voltage to the second word line for a second time, shorter than the first time; and
apply the second bias voltage to the second word line after the second time.

13. The memory device of claim 11,
wherein the plurality of word lines comprise a first word line disposed at a first height from the substrate, and a second word line disposed at a second height from the substrate, the first height being higher than the second height, and wherein the peripheral circuits are configured, during the erase operation, to:

apply a first bias voltage to the first word line for a first time;

apply a second bias voltage, lower than the first bias voltage, to the first word line after the first time;

apply the first bias voltage to the second word line for a second time, longer than the first time; and apply the second bias voltage to the second word line after the second time.

14. The memory device of claim 10, wherein the plurality of memory blocks are disposed in a cell region of each of a plurality of memory planes, wherein each memory plane of the plurality of memory planes comprises a first memory block and a second memory block arranged in a first direction, parallel to an upper surface of the substrate, wherein each memory plane of the plurality of memory planes has a boundary separated in the first direction, and wherein the first memory block of each memory plane of the plurality of memory planes is disposed closer to the boundary thereof than the second memory block of each memory plane of the plurality of memory planes.

15. The memory device of claim 14, wherein the peripheral circuit region is configured to:

maintain a first voltage of the plurality of word lines included in the first memory block as a first bias voltage until a first time;

increase the first voltage from the first bias voltage to a second bias voltage at the first time, in an erase operation for the first memory block;

maintain a second voltage of the plurality of word lines included in the second memory block as the first bias voltage until a second time, later than the first time; and increase the second voltage from the first bias voltage to the second bias voltage at the second time, in an erase operation for the second memory block.

16. The memory device of claim 10, wherein the cell region comprises a first substrate, and the peripheral circuit region comprises a second substrate, different from the first substrate, and wherein the cell region and the peripheral circuit region are stacked in a direction, perpendicular to an upper surface of the first substrate.

17. The memory device of claim 16, wherein the cell region comprises first metal pads, and the peripheral circuit region comprises second metal pads, and wherein the cell region and the peripheral circuit region are connected to each other in the direction, perpendicular to the upper surface of the first substrate by the first metal pads and the second metal pads.

18. A memory device, comprising:

a first memory plane and a second memory plane, each of the first memory plane and the second memory plane including a first memory block and a second memory block;

a first peripheral circuit including a first page buffer, a first row decoder, and a first word line voltage generator connected to the first memory plane; and a second peripheral circuit including a second page buffer, a second row decoder, and a second word line voltage generator connected to the second memory plane, wherein each of the first word line voltage generator and the second word line voltage generator is configured to control word line voltages differently in an erase operation for the first memory block and an erase operation for the second memory block, and wherein the first peripheral circuit is configured to, in the erase operation for the first memory block, control a voltage applied to each of a plurality of word lines included in the first memory block in the first memory plane to delete data based on a position of the first memory block within the first memory plane.

* * * * *